(12) United States Patent
Mochizuki et al.

(10) Patent No.: US 7,993,747 B2
(45) Date of Patent: Aug. 9, 2011

(54) LIGHT EMITTING DEVICES AND COMPOSITIONS COMPRISING LUMOPHORE-FUNCTIONALIZED NANOPARTICLES

(75) Inventors: Amane Mochizuki, San Diego, CA (US); Jesse Dan Froehlich, Vista, CA (US); Sheng Li, Vista, CA (US); Toshitaka Nakamura, Oceanside, CA (US); Robin Irene Young, Long Beach, CA (US); Ghassan E. Jabbour, Chandler, AZ (US); Michael E. Lauters, Hudson, WI (US)

(73) Assignee: Nitto Denko Corporation, Osaka (JP)

( * ) Notice: Subject to any disclaimer, the term of this patent is extended or adjusted under 35 U.S.C. 154(b) by 992 days.

(21) Appl. No.: 11/747,624

(22) Filed: May 11, 2007

(65) Prior Publication Data
US 2007/0262302 A1 Nov. 15, 2007

Related U.S. Application Data

(60) Provisional application No. 60/800,727, filed on May 15, 2006, provisional application No. 60/890,592, filed on Feb. 19, 2007.

(51) Int. Cl.
*B32B 5/16* (2006.01)
*C09K 11/06* (2006.01)

(52) U.S. Cl. ......... 428/403; 252/301.16; 252/301.21; 252/301.23; 252/301.35; 428/323; 428/331; 313/483; 313/494; 313/512

(58) Field of Classification Search ............ 428/403, 428/323, 331; 252/301.16, 301.21, 301.23, 252/301.35; 313/483, 494, 512
See application file for complete search history.

(56) References Cited

U.S. PATENT DOCUMENTS

| | | | |
|---|---|---|---|
| 5,707,745 A | 1/1998 | Forrest et al. | |
| 6,406,804 B1 * | 6/2002 | Higashi et al. | 428/690 |
| 6,517,958 B1 * | 2/2003 | Sellinger et al. | 428/690 |
| 6,528,188 B1 * | 3/2003 | Suzuki et al. | 428/690 |
| 6,657,224 B2 * | 12/2003 | Shi et al. | 257/40 |
| 6,870,054 B1 | 3/2005 | Deaton et al. | |
| 6,936,716 B1 | 8/2005 | Lin | |
| 6,939,624 B2 | 9/2005 | Lamansky et al. | |
| 6,989,273 B2 | 1/2006 | Hsieh et al. | |
| 7,001,536 B2 | 2/2006 | Thompson et al. | |
| 7,026,480 B2 | 4/2006 | Che et al. | |

(Continued)

FOREIGN PATENT DOCUMENTS

EP 1 359 630 A2 11/2003

(Continued)

OTHER PUBLICATIONS

Fenenko, et al., *Characterization of New Bright-Blue-Light-Emitting Poly (9, 9-Dioctylfluorenyl-2, 7-Diyl)-End Capped with Polyhedral Oligomeric Silsesquioxanes*, (2006), Japanese Journal of Applied Physics, Japan Society of Applied Physics, Tokyo, JP, vol. 45, No. 1B, pp. 550-554.

(Continued)

*Primary Examiner* — H. (Holly) T Le
(74) *Attorney, Agent, or Firm* — Knobbe Martens Olson & Bear LLP

(57) ABSTRACT

A light emitting composition includes a light-emitting lumophore-functionalized nanoparticle, such as an organic-inorganic light-emitting lumophore-functionalized nanoparticle. A light emitting device includes an anode, a cathode, and a layer containing such a light-emitting composition. In an embodiment, the light emitting device can emit white light.

85 Claims, 16 Drawing Sheets

U.S. PATENT DOCUMENTS

| | | | |
|---|---|---|---|
| 7,147,938 B2 * | 12/2006 | Helber et al. ............... | 428/690 |
| 2003/0162299 A1 | 8/2003 | Hsieh et al. | |
| 2004/0100189 A1 | 5/2004 | Adachi et al. | |
| 2004/0230061 A1 | 11/2004 | Seo et al. | |
| 2004/0262576 A1 | 12/2004 | Thompson et al. | |
| 2005/0017629 A1 | 1/2005 | Vitukhnovsky et al. | |
| 2005/0031903 A1 | 2/2005 | Park et al. | |
| 2005/0112400 A1 | 5/2005 | Seo et al. | |
| 2005/0123760 A1 * | 6/2005 | Cammack et al. ............ | 428/403 |
| 2005/0238914 A1 | 10/2005 | Lyu et al. | |
| 2006/0063026 A1 | 3/2006 | Holmes et al. | |
| 2006/0177695 A1 | 8/2006 | Ragini et al. | |
| 2006/0217527 A1 | 9/2006 | Chen et al. | |
| 2006/0228578 A1 | 10/2006 | Ren et al. | |
| 2007/0262302 A1 | 11/2007 | Mochizuki et al. | |
| 2009/0066234 A1 | 3/2009 | Chae | |
| 2009/0179552 A1 | 7/2009 | Froehlich | |

FOREIGN PATENT DOCUMENTS

| | | |
|---|---|---|
| EP | 2 030 266 A1 | 3/2009 |
| WO | WO 02/05971 A | 1/2002 |
| WO | WO 2004/060898 A1 | 7/2004 |
| WO | WO 2005/027583 A1 | 3/2005 |
| WO | WO 2005/037955 A | 4/2005 |
| WO | WO 2007/136588 A1 | 11/2007 |
| WO | WO 2009/006550 A1 | 1/2009 |

OTHER PUBLICATIONS

He, C. et al., *Highly Efficient Luminescent Organic Clusters with Quantum Dot-Like Properties*, (2004), J. Am. Chem. Soc., vol. 126, No. 25, pp. 7792-7793.

Jiang, et al., *High-Efficiency, Saturated Red-Phosphorescent Polymer Light-Emitting Diodes Based on Conjugated and Non-Conjugated Polymers Doped with an IR Complex*, (2004), Advanced Materials, Wiley VCH, Weinheim, DE, vol. 16, No. 6, pp. 537-541.

Lee, et al., *Stabilized Blue Luminescent Polyfluorenes: Introducing Polyhedral Oligomeric Silsesquioxane*, (2004), Macromolecules, vol. 37, No. 23, pp. 8523-8529.

Lee, et al., *Synthesis of Polyhedral Oligomeric Silsesquioxane-Functionalized Polyfluorenes: Hybrid Organic-Inorganic tt-Conjugated Polymers*, (2006), Synthetic Metals, vol. 156, No. 7-8, pp. 590-596.

Sellinger, et al., *Heck Coupling of Haloaromatics with Octavinylsilsesquioxane: Solution Processable Nanocomposites for Application in Electroluminescent Devices*, (2005), Chem. Comm., No. 29, pp. 3700-3702.

Xiao, et al., *Nano-Hybrid Luminescent Dot: Synthesis, Characterization and Optical Properties*, (2005), J. Mater. Chem., vol. 16, No. 9, pp. 829-836.

Chao, et al., White light emission from exciplex in a bilayer device with two blue light-emitting polymers (1998), *Applied Physics Letters* 73:426-428.

Gao, et al., White light electroluminescence from a hole-transporting layer of mixed organic materials (2000), *Synthetic Metals* 111-112:39-42.

Granstrom, et al., White light emission from a polymer blend light emitting diode (1996), *Applied Physics Letters* 68:147.

Gustafsson, et al., Flexible light-emitting diodes made from soluble conducting polymer (1992), *Nature* 357:477-479.

Hamada, et al., White light-emitting material for organic electroluminescent devices (1996), *Jpn. J. Appl. Phys. (part 2)* 35:L1339-L1341.

Kido, et al., Multilayer white light-emitting organic electroluminescent device (1995), *Science* 267:1332-1334.

Kido, et al., White-light-emitting organic electroluminescent device using lanthanide complexes (1996), *Jpn. J. Appl. Phys. (part 2)* 35:L394.

Kido, et al., White light-emitting organic electroluminescent devices using the poly(N-vinylcarbazole) emitter layer doped with three fluorescent chromospheres (1994), *Applied Physics Letters* 64:815.

Lee, et al., White light electroluminescence from soluble oxadiazole-containing phenylene vinylene ether-linkage copolymer (2001), *Applied Physics Letters* 79:308-310.

Tasch, et al, Efficient white light-emitting diodes realized with new processable blends of conjugated polymers (1997), *Applied Physics Letters* 71:2883-2885.

Yang, et al., Efficient blue-green and white light-emitting electrochemical cells based on poly[9,9-bis(3,6-dioxahepty1)-fluorene-2,7-diy1] (1997), *Journal of Applied Physics* 81:3294.

Adamovich, et al., "High efficiency single dopant white electrophosphorescent light emitting diodesy", New. J. Chem., 26, 1171-1178, 2002.

Anthopoulos, et al., "Solution-Processable Red Phosphorescent Dendrimers for Light-Emitting Device Applications", Advanced Materials, 16, No. 6, Mar. 18, 2004, 557-560.

Baldo, M. A., et al., "Highly Efficient Phosphorescent Emission From Organic Electroluminescent Devices", S. R. Nature 395, 151 (1998).

Baney, et al., "Silsesquioxanes", Chemical Reviews, vol. 95, 1409-1430, 1995.

Brooks, et al., "Synthesis and Characterization of Phosphorescent Cyclometalated Platinum Complexes" Inorg Chem. pp. 3055-3066, 2002, vol. 41, Issue 12.

Chen, et al., "Novel dendritic light-emitting materials containing polyhedral oligomeric silsequioxanes core" Thin Solid Films, Elsevier-Sequoia S.A. Lausanne, CH, vol. 514, No. 1-2, Aug. 30, 2006, pp. 103-109, XP025005888, ISSN: 0040-6090.

Chen, K.B., et al.: "Synthesis and Opto-electrical Properties of Stellar Polyfluorene Derivatives Containing Polyhedral Oligomeric Silsesquioxanes as the Center Core" Journal of Polymer Research, vol. 13, 2005, pp. 237-245.

Cheng, G., et al., "White Organic Light-Emitting Devices With A Phosphorescent Multiple Emissive Layer" Appl. Phys. Lett. 89, 043504 (2006).

Cho, et al., "Electroluminescent Polyhedral Oligomeric Silsesquioxane-Based Nanoparticle", Chemistry of Materials, vol. 18, No. 16, Aug. 8, 2006.

CIE primaries to match a color. A more detailed description of these terms may be found in CIE 1971, International Commission on Illumination, Colorimetry: Official Recommendations of the International Commission on Illumination, Publication CIE No. 15 (E-1. 3.1) 1971, Bureau Central de la CIE, Paris, 1971.

Cockburn, et al., "Reactivity of co-ordinated ligands. Part XV. Formation of complexes containing Group V donor atoms and metal-carbon -bonds", J. Chem. Soc., Dalton Trans., 1973, 404-410.

Communication Relating to the Results of the Partial International Search and Invitation to Pay Fees in Application No. PCT/US2009/060555 dated Feb. 8, 2010.

D'Andrade, B. W., et al, "Efficient Organic Electrophosphorescent White-Light-Emitting Device With A Triple Doped Emissive Layer", Adv. Mater. 16, 624 (2004).

Davis, "The Reaction of Some Diketones with Sodium Acetylide", J. Am. Chem. Soc., 1955, 77 (12), pp. 3284-3287.

Ding, et al., "Highly Efficient Green-Emitting Phosphorescent Iridium Dendrimers Based on Carbazole Dendrons", Advanced Functional Materials, 16, 575-581, 2006.

Evans, R.C., "Coordination Complexes Exhibiting Room-Temperature Phosphorescence." Coordination Chemistry Reviews, vol. 250, Mar. 6, 2006, pp. 2093-2126, XP002514299.

Fréchet, J. M. J.; Hawker, C. J. Comprehensive Polymer Science, 2nd Supplement; Pergamon: Oxford, England, 1996; pp. 71-132.

Furuta, et al., "Platinum-Functionalized Random Copolymers for Use in Solution-Processible, Efficient, Near-White Organic Light-Emitting Diodes", Journal of the American Chemical, vol. 126, No. 47, 15388-15389, Dec. 1, 2004.

Gerlach, et al., "Synthese von endo- und exo-1,3-Dimethyl-2,9-dioxa-bicyclo[3.3.1]nonan", Helvetica Chimica Acta, vol. 60, Issue 2, Date: Mar. 9, 1977, pp. 638-642.

Gerlach, et al., "Synthesen der Nonactinsäure", Helvetica Chimica Acta, vol. 57, Issue 7, Date: Nov. 6, 1974, pp. 2306-2321.

Gong, et al., "White Light Electrophosphorescence from Polyfluorene-Based Light-Emitting Diodes: Utilization of Fluorenone Defects", The Journal of Physical Chemistry, vol. 108, No. 25, Jun. 24, 2004, http://pubs.acs.org/JPCB.

Holder, et al., "New Trends in the Use of Transition Metal-Ligand Complexes for Applications in Electroluminescent Devices", Advanced Materials, 17, 1109-1121, 2005.

Imae and Kawakami, "Unique photoluminescence property of a novel perfectly carbazolesubstituted POSS", Journal of Materials Chemistry, 15, 4581-4583, 2005.

International Search Report for PCT Application No. PCT/US2007/011473 dated Nov. 8, 2007.

International Preliminary Report on Patentability for PCT Application No. PCT/US2008/069091, dated Oct. 14, 2009.

International Preliminary Report on Patentability for PCT Application No. PCT/US2008/082692, filed on May 18, 2010.

International Preliminary Report on Patentability in Application No. PCT/US2007/011473, dated Jul. 10, 2008.

International Search Report for PCT Application No. PCT/US2008/069091, filed on Jul. 2, 2008.

International Search Report for PCT Application No. PCT/US2008/082692, filed on Nov. 6, 2008.

International Written Opinion for PCT Application No. PCT/US2008/069091, filed on Jul. 2, 2008.

International Written Opinion for PCT Application No. PCT/US2008/082692, filed on Nov. 6, 2008.

Kawamura, "Energy transfer in polymer electrophosphorescent light emitting devices with single and multiple doped luminescent layers", Journal of Applied Physics, vol. 92, No. 1, Jul. 1, 2002.

Kolosov, et al., "1,8-Napthalimides in Phosphorescent Organic LEDs: The Interplay between Dopant, Exciplex, and Host Emission", Journal of the American Chemical Society, vol. 124, No. 23, Aug. 21, 2002.

Lamansky, "Highly Phosphorescent Bis-Cyclometalated Iridium Complexes: Synthesis, Photophysical Characterization, and Use in Organic Light Emitting Diodes", Journal of American Chemistry Society, 2001, 123, 4304-4312.

Lamansky, "Synthesis and Characterization of Phosphorescent Cyclometalated Iridium Complexes", Inorganic Chemistry, vol. 40, No. 7, Mar. 26, 2001, http://pubs.acs.org/IC.

Lamansky, et al., "Cyclometalated Ir complexes in polymer organic light-emitting devices", Journal of Applied Physics, vol. 92, No. 3, Aug. 1, 2002.

Lee, et al. "Polymer phosphorescent light-emitting devices doped with tris(2-phenylpyridine) iridium as a triplet emitter", Applied Physics Letters, vol. 77, No. 15, Oct. 9, 2000.

Lohse, Oliver et al., "The Palladium Catalysed Suzuki Coupling of 2- and 4-Chloropyridines", Synlett, 1999, 45-48, No. 1.

Lowry, et al., "Synthetically Tailored Excited States: Phosphorescent, Cyclometalated Iridum (III) Complexes and Their Application", Chemistry European Journal, 12 (31), 7970-7977, Oct. 25, 2006.

Nonoyama, "Benzo[h]quinolin-10-yl-N. Iridium(III) Complexes", Bulletin of the Chemical Society of Japan, vol. 47, No. 3, 1974, pp. 767-768.

Odian, G., "Principles of Polymerization", John Wiley, New York, 2nd Ed., 1981, pp. 177-179.

Official Communication in European Application No. 07794809, dated May 12, 2010.

Qian, et al., "Mechanism of the Palladium-Catalyzed Intramolecular Hydroalkylation of 7-Octene-2,4-dione" J. Am. Chem. Soc., 2003, 125 (8), pp. 2056-2057.

Skoog et al., "Principles of Instrumental Analysis"; Saunders College Publishing, Philadelphia, 1998, Ch. 15.

Sorenson, W. R., et al., "Preparative Methods of Polymer Chemistry", John Wiley, New York, 3rd ed., 2001, pp. 442-444.

Sprouse, S. et al., "Photophysical effects of metal-carbon .sigma. bonds in ortho-metalated complexes of iridium(III) and rhodium(III)", J. Am. Chem. Soc., 1984, 106 (22), pp. 6647-6653.

Su, Y.-J., et al., "Highly Efficient Red Electrophosphorescent Devices Based on Iridium Isoquinoline Complexes: Remarkable External Quantum Efficiency Over a Wide Range of Current", Advanced Materials, vol. 15, Issue 11, Date: Jun. 2003, pp. 884-888.

Suzuki, et al., "Highly efficient polymer light-emitting devices using ambipolar phosphorescent polymers", Applied Physics Letters 86, 103507, (2005).

Vögtle, F., "Dendrimers III: Design Dimension Function", Vol. Ed. Top. Curr. Chem. 2001, 212.

Williams, et al., "Excimer-Based White Phosphorescent Organic Light Emitting Diodes with Nearly 100%Internal Quantum Efficiency", Advanced Materials, 19, 197-202, 2007.

Xu, et al., "Synthesis and characterization of phosphorescent cyclometalated iridium complexes containing 2,5-diphenylpyridine based ligands", Applied Organometallic Chemistry, vol. 19, Issue 12, Dec. 2005, pp. 1225-1231.

Yang and Tsutsui, "Use of Poly(9-vinylcarbazole) as Host Material for Iridium Complexes in High-Efficiency Organic Light-Emitting Devices", Japanese Journal of Applied Physics, vol. 39, No. 8A, pp. L828-L829, Aug. 1, 2000.

Yeh, et al., "New Dopant and Host Materials for Blue-Light-Emitting Phosphorescent Organic Eletroluminescent Devices", Advanced Material, 17, No. 3, Feb. 10, 2005.

You, et al., "Inter-Ligand Energy Transfer and Related Emission Change in the Cyclometalated Heteroleptic Iridium Complex: Facile and Efficient Color Tuning over the Whole Visible Range by the Ancillary Ligand Structure", J. Am. Chem. Soc., 2005, 127 (36), pp. 12438-12439, Aug. 18, 2005.

* cited by examiner a). 1. 9-BBN, THF; 2. NaOH, $H_2O_2$   b). imidazole, DCM.   c). O-8, $Pt_2(dvs)_3$, toluene.   d). $(B)_3$, $Pt_2(dvs)_3$, toluene.

LIGHT EMITTING DEVICES AND COMPOSITIONS COMPRISING LUMOPHORE-FUNCTIONALIZED NANOPARTICLES

This application claims priority to U.S. Provisional Application Nos. 60/800,727, filed May 15, 2006, and 60/890,592, filed Feb. 19, 2007, both of which are hereby incorporated by reference in their entireties.

BACKGROUND

1. Field of the Invention

This invention relates to light emitting compositions and light-emitting devices that include the light-emitting compositions. Specifically, this invention relates to light emitting compositions and light-emitting devices that include a light-emitting lumophore-functionalized nanoparticle.

2. Description of the Related Art

Organic electroluminescent devices capable of emitting white light are desirable because of their potential utility as backplane lights for displays, overhead lighting and other lightweight, low profile, low power lighting applications. White light-emitting Organic Light-Emitting Diode (OLED) devices with high color purity and brightness exceeding 2000 cd/m$^2$ have been demonstrated at least since 1994. (1, 2) However, there is considerable difficulty in preparing white emitting OLEDs because it is generally quite difficult to prepare a device with a single layer that can emit white light. Several ineffective strategies have been employed to generate white light by electroluminescence including: preparation of devices with multiple emitting layers, e.g. red, green and blue (2); use of a single emitting layer doped with multiple small molecule emitters of different colors (1, 3, 4); blends of different color emitting polymers (5, 6); excimer (7) or "electromer" (8) emission from a semiconducting polymer; excimer emission from an interface (9); and broad emission from metal chelates (10).

There are significant drawbacks to all of these approaches. Preparation of devices with multiple emitting layers is typically more difficult and time consuming than preparation of devices with fewer layers. Device failure is more likely to occur due to interfacial defects, and matching the conduction band energies of multiple layers is complicated at best. Small molecules tend to have limited solubility in polymers. Blends of small molecule emitters and polymer dispersions of emitters tend to aggregate or phase separate, which often results in decreased device performance and poor color stability. Excimers and electromers often show field dependent emission spectra and their formation changes the transport properties of the device. Classical polymer-based systems are typically difficult to purify and exhibit poor batch-to-batch reproducibility. It is also very difficult to control the structure of classical polymer-based systems except in a very general sense. Finally, broad spectral emission from small single molecules typically heavily consists of green wavelength components and has a much lower efficiency for the red and blue components. The human eye is most sensitive to green light; hence in an actual device, it is desirable to have the red and blue wavelength components brighter than the green components. Molecular orbital and quantum mechanical theories forbid this type of emission from a single small molecule material.

The following articles are referred to above and incorporated by reference herein in their entireties:

1. Kido, J., Hongawa, K., Okuyama, K. & Nagai, K. White light-emitting organic electroluminescent devices using the poly(N-vinylcarbazole) emitter layer doped with three fluorescent chromophores. *Applied Physics Letters* 64, 815 (1994).
2. Kido, J., Kimura, M. & Nagai, K. Multilayer White light-Emitting Organic Electroluminescent Device. *Science* 267, 1332-1334 (1995).
3. Kido, J., Ikeda, W., Kimura, M. & Nagai, K. *Jpn. J. Appl. Phys.* (*part* 2) 35, L394 (1996).
4. Tasch, S. et al. *Applied Physics Letters* 71, 2883 (1997).
5. Yang, Y. & Pei, Q. *Journal of Applied Physics* 81, 3294 (1997).
6. Granstrom, M. & Inganas, O. *Applied Physics Letters* 68, 147 (1996).
7. Gao, Z. Q., Lee, C. S., Bello, I. & Lee, S. T. White light electroluminescence from a hole-transporting layer of mixed organic materials. *Synthetic Metals* 111-112, 39-42 (2000).
8. Lee, Y.-Z. et al. White light electroluminescence from soluble oxadiazole-containing phenylene vinylene ether-linkage copolymer. *Applied Physics Letters* 79, 308-310 (2001).
9. Chao, C.-I. & Chen, S.-A. White light emission from exciplex in a bilayer device with two blue light-emitting polymers. *Applied Physics Letters* 73, 426-428 (1998).
10. Hamada, Y. et al. White light-emitting material for organic electroluminescent devices. *Jpn. J. Appl. Phys.* (*part* 2) 35, L1339-L1341 (1996).

SUMMARY

The inventors have discovered methods for making light emitting compositions and devices using a nanoparticle approach. Some embodiments described herein relate to a lumophore-functionalized nanoparticle that can include a nanoparticle core and at least one lumophore covalently attached to the nanoparticle core. For example, in an embodiment, the lumophore-functionalized nanoparticle is an organic-inorganic lumophore-functionalized nanoparticle. In preferred embodiments, the lumophore-functionalized nanoparticles described herein are light-emitting, e.g., white light-emitting. Various embodiments provide a composition that comprises a light-emitting lumophore-functionalized nanoparticle as described herein.

An embodiment described herein relates to a lumophore-functionalized nanoparticle represented by Formula (I):

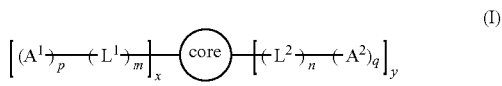

wherein core can be a nanoparticle core; $A^1$ and $A^2$ can each be a lumophore; $L^1$ and $L_2$ can each be a linking group; m can be 0 or an integer in the range of 1 to 10; n can be an integer in the range of 1 to 10; p can be an integer in the range of 0 to 5$^m$; q can be an integer in the range of 1 to 5$^n$; x can be 0 or an integer in the range of 1 to 100; wherein for x≧2 each $L^1$ can be the same or different and each $A^1$ can be the same or different; y can be an integer in the range of 1 to 100; wherein for y≧2 each $L^2$ can be the same or different and each $A^2$ can be the same or different; and with the proviso that $L^1$ and $L^2$ can be topologically distinct from the core, compositionally distinct from the core, or both.

An embodiment relates to a lumophore-functionalized nanoparticle as described herein wherein m in Formula (I) can be zero and at least one $A^1$ lumophore can emit light having a wavelength different from at least one $A^2$ lumophore. An embodiment relates to a light-emitting composition as described herein wherein m in Formula (I) can be 1 and at least one $A^1$ lumophore can emit light having a wavelength different from at least one $A^2$ lumophore. In an embodiment, n in Formula (I) can be 1.

The light-emitting lumophore-functionalized nanoparticles and compositions described herein can include a suitable nanoparticle core known to those skilled in the art. In some embodiments, the nanoparticle core can comprise a moiety selected from the group consisting of a silsequioxane, a cyclophosphazene, a triazine, a cyclodextrin, a calixarene, and/or a phthalocyanine, and a silica particle. In an embodiment, the silsequioxane can comprise a 1,3,5,7,9,11,13,15-octakis(dimethylsilyloxy)pentacyclo-[9.5.1.1$^{3,9}$.1$^{5,15}$.1$^{7,13}$]-octasiloxane.

A wide variety of lumophores can be used and attached either directly or via one or more linking groups to the nanoparticle core. For example, in an embodiment, the $A^1$ lumophore and the $A^2$ lumophore in Formula (I) can each be independently selected from the group consisting of an orange light-emitting lumophore, a blue light-emitting lumophore and a yellow light-emitting lumophore.

In some embodiments, the lumophore can be selected from the group consisting of an orange light-emitting lumophore, a blue light-emitting lumophore and a yellow light-emitting lumophore. In one embodiment, the blue light-emitting lumophore can emit light having a wavelength ranging from about 400 nm to about 480 nm. For example, the blue emitting lumophore can be a polyparaphenylene lumophore, a fluorene lumophore, a stilbene lumophore, a biphenyl lumophore or a polyaromatic hydrocarbon lumophore. In an embodiment, the blue light-emitting lumophore can be a fluorene lumophore such as a 2,7-bis-(2,2-diphenyl-vinyl)-fluorene lumophore. In another embodiment, the orange light-emitting lumophore can emit light having a wavelength ranging from about 560 nm to about 750 nm. Suitable orange light-emitting lumophore include but are not limited pyrromethene lumophores, rhodamine lumophores, metalloporphyrin lumophores, metallophthalocyanine lumophores, pyran-4-ylidene-malononitrile lumophores and rubrene lumophores. In an embodiment, the orange light-emitting lumophore can be a rubrene lumophore such as a 2-[2-tert-butyl-6-(2-{4-[(4-hexyl-phenyl)-phenyl-amino]-phenyl}-vinyl)-pyran-4-ylidene]-malononitrile lumophore. In some embodiments, the yellow light-emitting lumophore can emit light having a wavelength in the range from about 480 nm to about 560 nm. Exemplary yellow-emitting lumophores include a pyrromethene lumophore, a rhodamine lumophore, a metalloporphyrin lumophore, a metallophthalocyanine lumophore, a pyran-4-ylidene-malononitrile lumophore and a rubrene lumophore. In an embodiment, the yellow light-emitting lumophore can be a rubrene lumophore such as 2-{2-tert-butyl-6-[4-(N-phenyl-N-allyl)phenyl]-vinyl}-pyran-4-ylidene]-malononitrile.

The number of lumophores attached either directly or via a linking group to the nanoparticle core can vary. In some embodiments, the number of lumophores attached to the nanoparticle core can be in the range of from 1 to about 100. In an embodiment, the number of the lumophores attached to the nanoparticle core can be 8. In other embodiments, the number of the lumophores attached to the nanoparticle core can be in the range of about 8 to about 80. In other embodiments, the number of the lumophores attached to the nanoparticle core can be in the range of about 8 to about 60. In other embodiments, the number of the lumophores attached to the nanoparticle core can be in the range of about 8 to about 40. In some embodiments, the number of the lumophores attached to the nanoparticle core can be in the range of from about 8 to about 20. In some embodiments, the number of the lumophores attached to the nanoparticle core can be 15. In some embodiment, the number of the lumophores attached to the nanoparticle core can be 16. In some embodiments, the number of the lumophores attached to the nanoparticle core can be 22. In some embodiment, the number of the lumophores attached to the nanoparticle core can be 23. In some embodiments, the number of the lumophores attached to the nanoparticle core can be 24.

Another embodiment described herein relates to a light emitting device that can include: an anode layer comprising a high work function metal; a cathode layer comprising a low work function metal; and a light-emitting layer positioned between, and electrically connected to, the anode layer and the cathode layer, wherein the light-emitting layer can include a lumophore-functionalized nanoparticle as described herein. In an embodiment, the lumophore-functionalized nanoparticle is represented by Formula (I). In an embodiment, the lumophore-functionalized nanoparticle is an organic-inorganic lumophore-functionalized nanoparticle. In an embodiment, the organic-inorganic lumophore-functionalized nanoparticle comprises a nanoparticle core that comprises inorganic elements such as phosphorous (P), silicon (Si), and/or a metal. For example, in an embodiment a nanoparticle core comprises a moiety selected from the group consisting of a silsequioxane, a cyclophosphazene, a metal phthalocyanine, and a silica particle. The light-emitting compositions described herein can include two or more lumophore-functionalized nanoparticles and/or other materials in addition to the lumophore-functionalized nanoparticle(s).

An anode layer may comprise a conventional material such as a metal, mixed metal, alloy, metal oxide or mixed-metal oxide, or a conductive polymer. Suitable metals include the Group 1 metals, the metals in Groups 4, 5, 6, and the Group 8-10 transition metals. If the anode layer is to be light-transmitting, mixed-metal oxides of Group 12, 13, and 14 metals or alloys thereof, such as Au, Pt, and indium-tin-oxide (ITO), may be used. The anode layer may include an organic material such as polyaniline, e.g., as described in "Flexible light-emitting diodes made from soluble conducting polymer," Nature, vol. 357, pp. 477-479 (11 Jun. 1992). Examples of suitable high work function metals include but are not limited to Au, Pt, indium-tin-oxide (ITO), or alloys thereof.

A cathode layer may include a material having a lower work function than the anode layer. Materials for the cathode layer may be selected from alkali metals of Group 1, Group 2 metals, Group 12 metals including rare earth elements, lanthanides and actinides, materials such as aluminum, indium, calcium, barium, samarium and magnesium, and combinations thereof. Li-containing organometallic compounds, LiF, and Li$_2$O may also be deposited between the organic layer and the cathode layer to lower the operating voltage. Suitable low work function metals include but are not limited to Al, Ag, Mg, Ca, Cu, Mg/Ag, LiF/Al, CsF, CsF/Al or alloys thereof. In an embodiment, the anode layer can have a thickness in the range of about 1 to about 1000 nm. In an embodiment, the cathode layer can have a thickness in the range of about 1 to about 1000 nm.

An embodiment described herein relates to the light-emitting device wherein the organic-inorganic lumophore-functionalized nanoparticle can include a nanoparticle core and two or more lumophores covalently attached to the nanoparticle core, wherein at least one lumophore emits light having a wavelength different from at least one of the other lumophores. In one embodiment, at least one lumophore can emit light having a wavelength ranging from 560 nm to 750 nm and at least one of the other lumophores can emit light in the wavelength ranging from 400 nm to 480 nm. In another embodiment, the ratio of the number of lumophores that emit light having a wavelength ranging from 560 nm to 750 nm to the number of the other lumophores that emit light in the wavelength ranging from of 400 nm to 480 nm can be in the range of from about 1:99 to about 99:1. In some embodiments, the ratio of the number of lumophores that emit light having a wavelength in the range from 560 nm to 750 nm to the number of lumophores that emit light having a wavelength in the range from of 400 nm to 480 nm is in the range of from about 1:21 to about 1:21. In an embodiment, at least one lumophore emits light having a wavelength in the range from 480 nm to 560 nm and at least one other lumophore emits light having a wavelength in the range from 400 nm to 480 nm. In some embodiments, the ratio of the number of lumophores that emit light having a wavelength in the range from 480 nm to 560 nm to the number of other lumophores that emit light having a wavelength in the range of 400 nm to 480 nm is in the range of from about 1:99 to about 99:1. In certain embodiment, the ratio of the number of $A^1$ lumophores that emit light having a wavelength in the range from 480 nm to 560 nm to the number of $A^2$ lumophores that emit light having a wavelength in the range from 400 nm to 480 nm is in the range of from about 1:21 to about 21:1.

An embodiment described herein relates to the light-emitting device wherein the light-emitting composition layer can include a plurality of first organic-inorganic lumophore-functionalized nanoparticles, wherein at least a portion of the plurality of first nanoparticles includes from about 8 to about 24 blue light-emitting lumophores; and a plurality of second organic-inorganic lumophore-functionalized nanoparticles, wherein at least a portion of the plurality of second nanoparticles includes from about 8 to about 24 red light-emitting lumophores. In one embodiment, the ratio of the number of first nanoparticles to the number of second nanoparticles can be in the range of from about 1 to about 2000. In another embodiment, the ratio of the number of first nanoparticles to the number of second nanoparticles can be in the range of from about 1 to about 1000.

The linking groups can comprise various moieties. For example, in some embodiments, $L^1$ and $L^2$ in Formula (I) can each independently comprise a divalent, a trivalent, a tetravalent or a pentavalent moiety. In an embodiment, the divalent moiety is selected from the group consisting of:

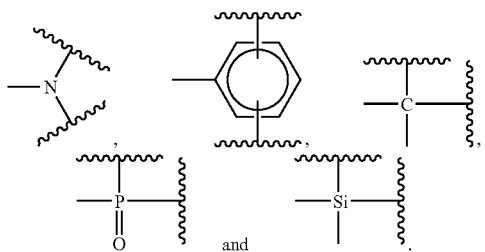

In an embodiment, the trivalent moiety can be selected from the group consisting of

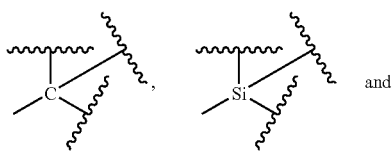

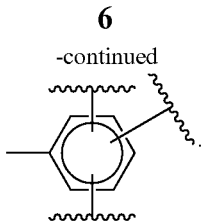

In another embodiment, the tetravalent moiety can be selected from the group consisting of

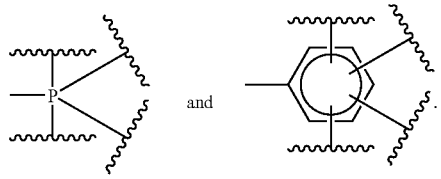

In an embodiment, the pentavalent moiety can be selected from the group consisting of

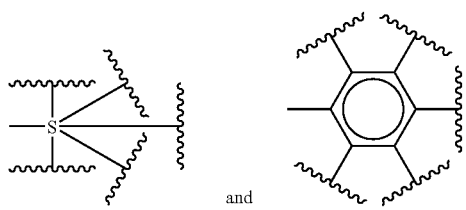

In certain embodiment, $L^1$ and $L^2$ can each comprise

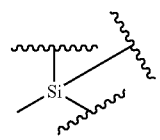

The amount of the lumophore-functionalized nanoparticle in the light-emitting composition can vary. In some embodiments, the amount of lumophore-functionalized nanoparticle in the light-emitting composition layer can be in the range of from about 1% to about 100% by weight based on total weight of the light-emitting layer. In an embodiment, the amount of lumophore-functionalized nanoparticle in the light-emitting layer can be in the range of from about 1% to about 10% by weight based on total weight of the light-emitting layer. In some embodiments, the light-emitting layer can have a thickness in the range of about 50 to about 250 nm.

The light-emitting composition or layer can be a composite material that contains multiple ingredients. For example, in some embodiments, the light-emitting device comprises a hole transport material and/or an electron transport material. Various hole transport materials can be utilized in the light-emitting composition and thus in the device. For example, the hole transport material can be but is not limited to an aromatic amine, an aromatic phosphine, a thiophene, a polymer thereof, or a mixture thereof. The light-emitting composition can comprise the hole transport material and/or the electron transport material. In some embodiments, the amount of the hole transport material in the light-emitting composition can be in the range of from about 1% to about 99% by weight based on total weight of the light-emitting composition. Preferably, the amount of the hole transport material in the light-emitting composition can be in the range of from about 30% to about 70% by weight based on total weight of the light-emitting composition.

Various electron transport materials can also be used in the light-emitting composition. Examples of suitable electron transport material include but are not limited to an aromatic oxadiazole, a quinoline, a triazole, a pyridine, a dicyanoimidazole, a cyano aromatic, a polymer thereof, or a mixture thereof. In some embodiments, the amount of the electron transport material in the light-emitting composition can be in the range of from about 1% to about 99% by weight based on total weight of the light-emitting composition. Preferably, the amount of the electron transport material in the light-emitting composition can be in the range of from about 30% to about 70% by weight based on total weight of the light-emitting composition.

If desired, additional layers may be included in the light-emitting device. In an embodiment, the light-emitting device can include an electron transport/injection layer e.g., between the cathode layer and the light emitting layer. The lowest un-occupied molecular orbital (LUMO) energy level of the electron transport/injection material layer is preferably high enough to prevent it from receiving an electron from the light emitting layer. The energy difference between the LUMO of the electron transport/injection material and the work function of the cathode layer is preferably small enough to allow efficient electron injection from the cathode. Examples of suitable materials for inclusion in the electron transport/injection layer include but are not limited to aluminum quinolate (Alq$_3$), 2-(4-biphenylyl)-5-(4-tert-butylphenyl)-1,3,4-oxadiazole (PBD), phenanthroline, quinoxaline, 1,3,5-tris [N-phenylbenzimidazol-z-yl]benzene (TPBI), or the derivatives thereof. In another embodiment, the device can include a hole blocking layer, e.g., between the electron transport/injection layer and the light-emitting layer. Suitable materials that can be included in the hole blocking layer include but are not limited to bathocuproine (BCP), 3,4,5-triphenyl-1,2,4-triazole, 3,5-bis(4-tert-butyl-phenyl)-4-phenyl-[1,2,4]triazole, 2,9-dimethyl-4,7-diphenyl-1,10-phenanthroline, or 1,1-bis(4-bis(4-methylphenyl)aminophenyl)-cyclohexane. In still another embodiment, the light-emitting device can include a hole injection layer, e.g., between the anode layer and the light emitting layer, which comprises a polythiophene derivative such as polytheylenedioxythiophene (PEDOT)/polystyrene sulphonic acid (PSS), a benzidine derivative such as N,N,N',N'-tetraphenylbenzidine, poly(N,N'-bis(4-butylphenyl)-N,N'-bis(phenyl)benzidine), a triphenylamine or phenylenediamine derivative such as N,N'-bis(4-methylphenyl)-N,N'-bis(phenyl)-1,4-phenylenediamine, 4,4',4"-tris(N-(naphthylen-2-yl)-N-phenylamino)triphenylamine, an oxadiazol derivative such as 1,3-bis(5-(4-diphenylamino)phenyl-1,3,4-oxadiazol-2-yl) benzene, a polyacetylene derivative such as poly(1,2-bis-benzylthio-acetylene), or a phthalocyanine metal complex derivative such as phthalocyanine copper.

In some of the embodiments described herein the light-emitting composition is configured to emit white light.

These and other embodiments are described in greater detail below.

BRIEF DESCRIPTION OF THE DRAWINGS

FIG. 11 also shows a UV visible spectrum of light emitted by the device 90.

FIG. 12 also shows a UV visible (UV-VIS) spectrum of light emitted by the device 100.

DETAILED DESCRIPTION

Figure 1:
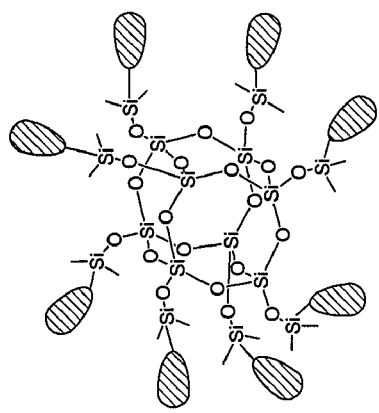
FIG. 1 illustrates a general process for preparing a lumophore-functionalized nanoparticle comprising a silsequioxane nanoparticle core.
Figure 1:
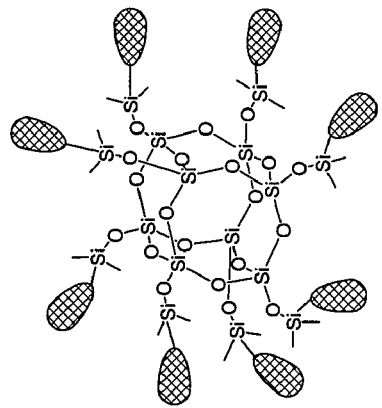
Figure 1:
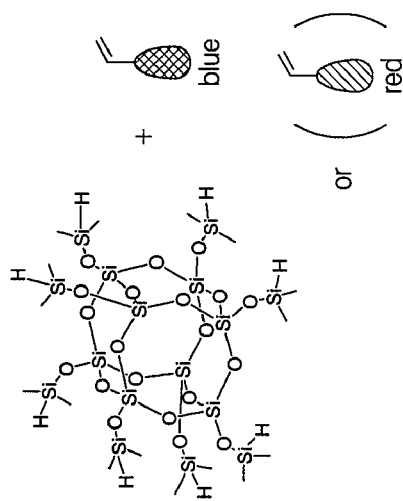

A nanoparticle is a particle having a cross-sectional measurement (e.g., diameter if spherical) of about 100 nm or less. Dendrimers are examples of nanoparticles. Nanoparticles may be soluble or insoluble polymers (copolymers, hyperbranched polymers, etc), having the ability to aggregate, accumulate and/or self-assemble into particles of about 100 nm or less. The silsequioxane group of the formula (II) is an example of a nanoparticle.

Dendrimers are branched molecular materials that exhibit useful properties of both small molecules and polymers. See e.g. Fréchet, J. M. J.; Hawker, C. J. Comprehensive Polymer Science, 2nd Supplement; Pergamon: Oxford, England, 1996; pp 140-206. A dendrimer is a substantially monodisperse synthetic macromolecule possessing a three-dimensional architecture that comprises a central core, highly branched but substantially regular iterative building units, and numerous peripheral ending groups. A more detailed description of these terms is found in G. Odian, Principles of Polymerization, John Wiley, New York, $2^{nd}$ Ed., 1981, pp. 177-179 and in W. R. Sorenson, F. Sweeney and T. W. Campbell, Preparative Methods of Polymer Chemistry, John Wiley, New York, 3rd ed., 2001, pp. 442-444, both of which are hereby incorporated by reference in their entireties. The numerous functional groups in the periphery of dendrimers are ideally suited for the incorporation of light-emitting lumophores, e.g., by covalent bonding. Modifications of peripheral functional groups in dendrimers to accommodate the attachment of lumophores can be carried out by general methods described in "Dendrimers III: Design Dimension Function", Vögtle, F., Vol. Ed. Top. Curr. Chem. 2001, 212. Similar methods may also used to functionalize polymer nanoparticles.

A "chromophore" is a molecule or aggregate of molecules that can absorb electromagnetic radiation. An "excited state" is an electronic state of a molecule in which the electrons populate an energy state that is higher than another energy state for the molecule.

A "lumophore" is a chromophore that emits light when exposed to electromagnetic radiation. The "quantum yield" of a chromophore is the ratio of the number of emitted photons to the number of photons absorbed. Lumophores may be referred to herein as light-emitting groups and vice-versa.

The term "silsequioxane" is the general name for a family of polycyclic compounds consisting of silicon and oxygen. Silsequioxanes are also known as silasesquioxanes and polyhedral oligomeric silsesquioxanes (POSS).

The "work function" of a metal is a measure of the minimum energy required to extract an electron from the surface of the metal.

A "high work function metal" is a metal or alloy that easily injects holes and typically has a work function greater than or equal to 4.5.

A "low work function metal" is a metal of alloy that easily loses electrons and typically has a work function less than 4.3.

A material is white light-emitting if it emits white light. White light is light having the approximate CIE color coordinates (X=⅓, Y=⅓). The CIE color coordinates (X=⅓, Y=⅓) is defined as the achromatic point. The X and Y color coordinates are weights applied to the CIE primaries to match a color. A more detailed description of these terms may be found in CIE 1971, International Commission on Illumination, Colorimetry: Official Recommendations of the International Commission on Illumination, Publication CIE No. 15 (E-1.3.1) 1971, Bureau Central de la CIE, Paris, 1971 and in F. W. Billmeyer, Jr., M. Saltzman, Principles of Color Technology, 2nd edition, John Wiley & Sons, Inc., New York, 1981, both of which are hereby incorporated by reference in their entireties.

An embodiment provides a lumophore-functionalized nanoparticle that comprises a nanoparticle core and at least one lumophore covalently attached to the nanoparticle core. The lumophore-functionalized nanoparticle can be organic or organic-inorganic (e.g., comprising both organic and inorganic elements). For example, the nanoparticle core to which the lumophores are attached can be organic (e.g., may comprise a phthalocyanine, a triazine, and/or a cyclodextrin), inorganic (e.g., may comprise a silsequioxane and/or a silica particle), or organic-inorganic (e.g., may comprise a metal phthalocyanine complex). Likewise, the lumophores attached to the nanoparticle core can be organic or organic-inorganic (e.g., containing a metal ion). For example, in an embodiment, the lumophore is a metalloporphyrin lumophore. In an embodiment, the lumophore-functionalized nanoparticle is represented by Formula (I).

Lumophore-functionalized nanoparticles can be prepared in various ways, e.g., by attaching the one or more lumophores to a nanoparticle core. A preferred method for making nanoparticles that emit white light is illustrated in FIG. 1. The covalent attachment of lumophores to the a silsequioxane nanoparticle core is preferably carried out in the general manner described for the attachment of various groups to silsequioxane in PCT WO 02/05971, which is hereby incorporated by reference. A preferred nanoparticle core is a silsequioxane as shown in Formula (II), more preferably a 1,3,5, 7,9,11,13,15-octakis(dimethylsilyloxy)pentacyclo-[9,5.1. $1^{3,9}.1^{5,15}.1^{7,13}$]octasiloxane as shown in Formula (III).

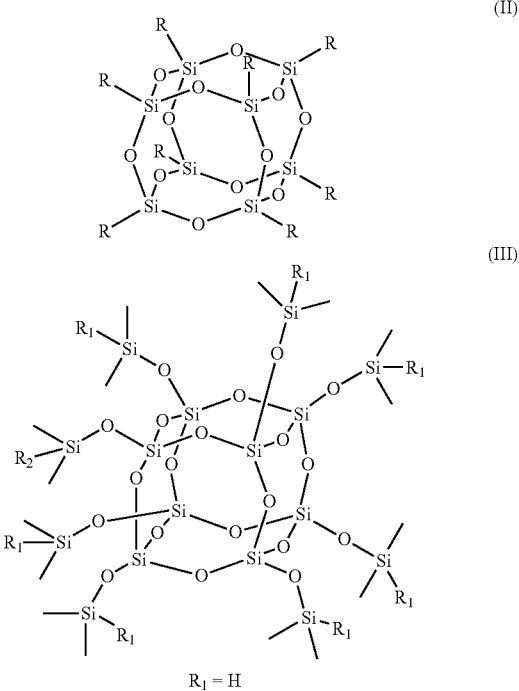

Light-emitting nanoparticles that emit various colors may be created by attaching 2 or more lumophores to a nanoparticle core in varying ratios. For example, red, blue, orange, and/or yellow lumophores containing a primary alkene or another functional group may be attached to the nanoparticle core randomly from a mixture containing the lumophores in varying ratios. The numbers of each lumophore on each nanoparticle core can also be precisely controlled such that there can be a selected number of one type of lumophore and a selected number of another type of lumophore (e.g., one red lumophore and seven blue lumophores or 21 blue lumophores and 1 yellow lumophore) on the nanoparticle core. An example of a method for controlling the number of lumophores is as follows: a red lumophore comprising a primary alkene group is attached to a silsequioxane via hydrosilation under high dilution conditions using a platinum catalyst, e.g. hexachloroplatinic acid or Pt(dvs) (platinum-divinyl tetramethyldisiloxane complex). The silsequioxane starting material is present in molar excess, preferably greater than 1.1 fold molar excess, more preferably greater than 1.5 fold molar excess, most preferably greater than 2.0 fold molar excess. The resulting product is a silsequioxane having about seven unreacted functional groups, e.g. silane (Si—H), and about one covalently attached red light-emitting lumophore. The red light-emitting lumophore-functionalized silsequioxane (preferably comprising about 7 Si—H groups) is then separated from the unreacted silsequioxane starting material via methods known to those skilled in the art.

A blue light-emitting lumophore can then be attached to the red light-emitting lumophore-substituted silsequioxane, preferably by the same general method as used for the attachment of the red light-emitting lumophore except that the reaction is controlled to provide at least one molar equivalent of blue light-emitting lumophore per unreacted functional group on the red light-emitting lumophore substituted silsequioxane.

One or more lumophores can also be attached to a nanoparticle core via a linking group. For example, one of more blue-lighting emitting lumophores may be attached to a trivalent silicon-based linking group using a mild base (e.g., imidazole). The linking group with one or more lumophores attached can then be connected to the nanoparticle core using a similar method as described herein for attaching lumophores directly to the nanoparticle core. Those skilled in the art will understand that reference herein to attachment of a lumophore to a nanoparticle core includes both direct attachment and attachment via a linking group, unless otherwise stated. Linking groups may be divalent or multivalent, as described in greater detail below.

Figure 2:
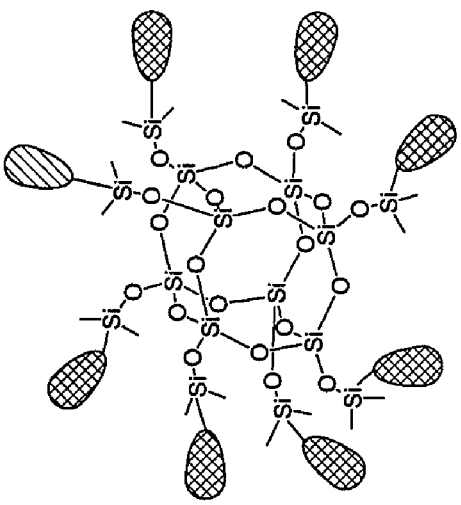
FIG. 2 illustrates another embodiment of a general process for preparing a lumophore-functionalized nanoparticle comprising a silsequioxane nanoparticle core.
Figure 2:
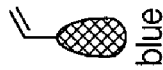
Figure 2:
Figure 2:
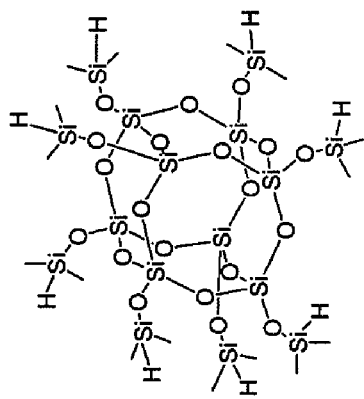

Other lumophore-functionalized nanoparticles may be prepared in a similar manner by attaching various lumophores of various colors to the nanoparticle core either directly and/or via a linking group, e.g., as illustrated in FIG. 2. For example, a nanoparticle core (e.g., silsequioxane) may be functionalized with red, orange, blue and green lumophores by using a reaction sequence similar to that described above, except that the molar ratios of the reactants are adjusted so that the nanoparticle core contains unreacted functional groups after functionalization with the red and blue lumophores. These unreacted functional groups may then be reacted with green lumophores to provide a light-emitting lumophore-functionalized nanoparticle core. As another example, a nanoparticle core (e.g., silsequioxane) may be functionalized with red and blue lumophores where both the red and blue lumophores are attached to the nanoparticle core via one or more linking groups, such as those described herein, by using a reaction sequence similar to that described above, except that the molar ratios of the reactants are adjusted so that the nanoparticle core contains unreacted functional groups after functionalization with the red and blue lumophores. These unreacted functional groups may then be reacted with green lumophores to provide a light-emitting lumophore-functionalized nanoparticle core in which the green lumophores are attached directly and the red and blue lumophores are attached via one or more linking groups. Those skilled in the art will appreciate that the functionalization process described above may be modified by controlling the respective molar ratios and number of reaction stages to produce light-emitting lumophore-functionalized nanoparticle core having 1, 2, 3, 4, 5, 6, 7, 8, 9, 10, 11, 12, 13, 14, 15, 16, 17, 18, 19, 21, 22, 23, 24, 25, 25, 27, 28, 29, 30, 31, 32 or more different lumophores. Similarly, the functionalization process described above may be further modified (also by adjusting the respective molar ratios and number of reaction stages) to produce light-emitting lumophore-functionalized silsequioxane having various ratios of particular lumophores (e.g., 8 red; 8 blue; 8 green; 8 orange; 4 red and 4 blue; 4 blue and 4 green; 4 red and 4 green; 3 orange, 3 blue and 2 yellow; 3 red, 3 blue and 2 green; 2 red, 3 blue and 3 green; 3 red, 2 blue and 3 green, 1 red and 21 blue, 1 orange and 21 blue; 1 yellow and 21 blue, etc.). The colors of the lumophores are not limited to red, orange, green and blue, and thus the functionalization processes described above may be modified to utilize virtually any combination of lumophores, each having virtually any individual color, e.g., cyan, orange, red-orange, yellow, purple, magenta, etc. A wide variety of lumophores are commercially available and may be modified (if such modification is needed) to contain a functional group (such as a primary alkene group) capable of reacting with a functional group (such as silane) on the nanoparticle core. The process described above may also be modified to utilize other nanoparticles.

Lumophore-functionalized nanoparticles may be configured to emit various colors, depending on the relative ratios and identities of the lumophores. The relative ratios of each lumophore-functionalized nanoparticle are preferably selected so that the resulting mixture of the lumophore-functionalized nanoparticles emits the desired color, (e.g., white light). In another embodiment, the ratio of lumophore nanoparticles is selected to provide a white light-emitting layer. White light can be obtained by the appropriate choice of lumophores. In another embodiment, the chosen lumophores have Commission Internationale de L'Eclairage (CIE) color coordinates that lie on a line which substantially intersects the achromatic point. For example, a mixture of organic-inorganic lumophore-functionalized nanoparticles, e.g., red and blue lumophore-functionalized nanoparticles, may be used to generate white light. The white light-emitting nanoparticles can be configured to emit white light under conditions known to those skilled in the art such as, for example, irradiation with ultraviolet light, preferably light with a wavelength between about 250 nm and about 420 nm.

In an embodiment, the nanoparticle core can be a single silsequioxane with a silsequioxane core represented by Formula (II). The silsosequioxane core shown in Formula (II) has a relatively stiff cubical structure and the lumophores, represented by R groups in Formula (II), can be attached at the vertices of the silsequioxane. This invention is not bound by any theory of operation, but it is believed that the nanoparticle core acts to decouple the emitting states of the lumophores and prevent physical interactions between chromophore moieties. Moreover, it is believed that the incorporation of lumophores onto the exterior surface of the nanoparticle core, rather than embedding the lumophores in the nanoparticle matrix or core, substantially reduces the interaction between the lumophores and hence prevents aggregation. As a result, the emission of white light by the lumophore-functionalized nanoparticles described herein is improved.

An embodiment provides a light-emitting composition that includes a blue light-emitting lumophore-functionalized nanoparticle and a red light-emitting lumophore-functionalized nanoparticle. For example, the light-emitting composition can comprise silsequioxane groups of the Formulae (IV) and (V).

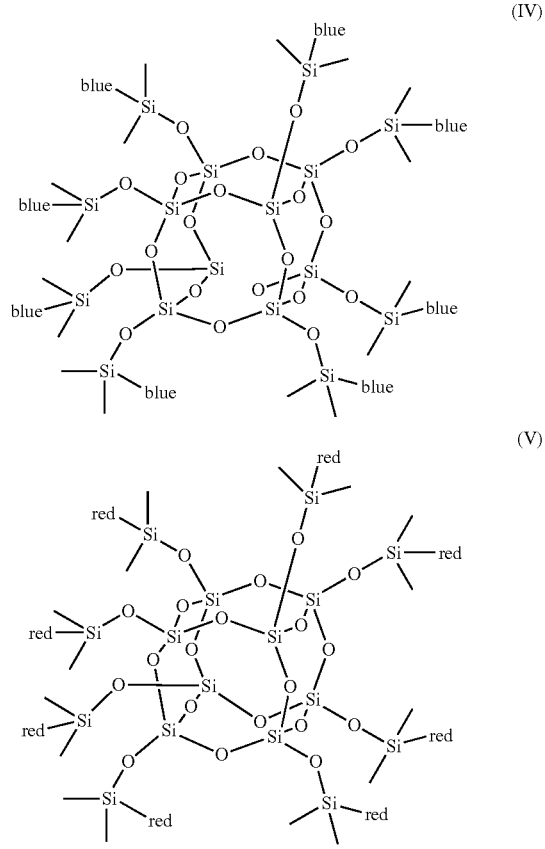

In Formulae (IV) and (V), "blue" and "red" represent independently selected lumophores with emission wavelengths that have CIE color coordinates that lie on a line that substantially intersects the achromatic point.

Figure 3:
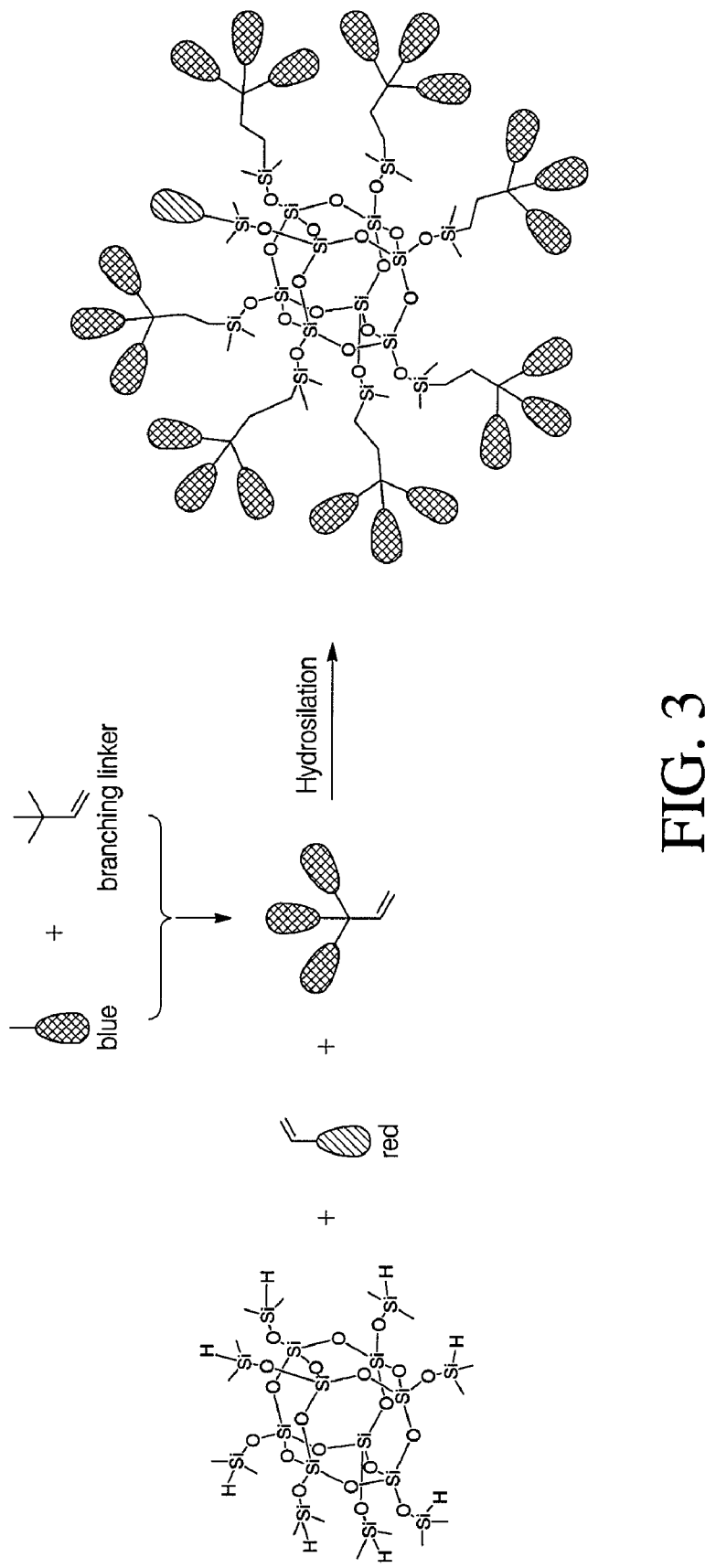
FIG. 3 a general process for preparing a lumophore-functionalized nanoparticle comprising branched linking groups and a silsequioxane nanoparticle core.

As noted above, a lumophore may be attached to a nanoparticle core using a linking unit, which may be multivalent or branched, e.g., as illustrated in FIG. 3. For example, in some embodiments, $L^1$ and $L^2$ in Formula (I) can each independently comprise a divalent, a trivalent, a tetravalent or a pentavalent moiety. In this context, the valency indicates the number of lumophores to which the linking group is attached. For example, in an embodiment, the linking group comprises a divalent moiety selected from the group consisting of:

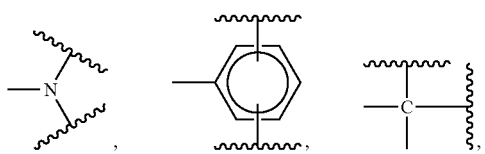

-continued

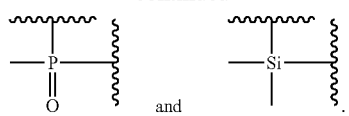

and

These linking units are divalent, as depicted by the symbol

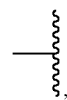

which indicates a chemical bond between the moiety and the lumophore, or between the moiety and another part of the linking unit that in turn attaches to the lumophore. The ordinary chemical bond symbol "—" indicates a bond between the moiety and the nanoparticle core, or between the moiety and another part of the linking unit that in turn attaches to the nanoparticle core.

In an embodiment, the trivalent moiety can be selected from the group consisting of

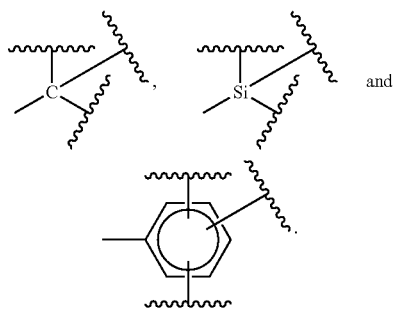

For example, those skilled in the art will recognize that $R_4$ in Formulae (VI) and (VII) comprises a trivalent moiety of the formula

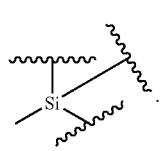

In an embodiment, the tetravalent moiety can be selected from the group consisting of

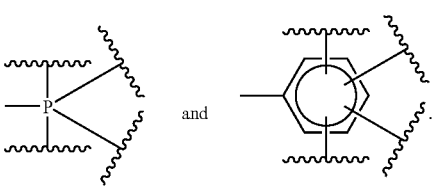

In an embodiment, the pentavalent moiety can be selected from the group consisting of

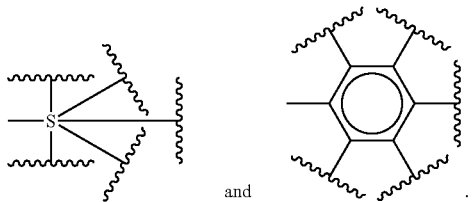

In certain embodiment, $L^1$ and $L^2$ can each comprise

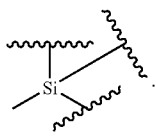

This invention is not bound by theory, but it is believed that the use of a linking units helps to advantageously minimize the intramolecular energy transfer between lumophores that are attached to the same nanoparticle core. By attaching lumophores to the nanoparticle core using a multivalent linking unit, the number of lumophores attached to the nanoparticle core can be increased as compared to the use of a divalent linking unit.

In an embodiment, one or more of the linking units are different from the nanoparticle core to which they are attached, e.g., topologically distinct from the core, compositionally distinct from the core, or both. For example, in an embodiment, $L^1$ and $L^2$ in Formula (I) are topologically distinct from the nanoparticle core, compositionally distinct from the nanoparticle core, or both. In this context, the terms "topologically distinct" and "compositionally distinct" refer to differences in topology and composition, respectively, between a linking unit and the nanoparticle core to which it is attached. For example, some dendrimers comprise successive onion skin-like layers or "generations" that have essentially the same degree of branching as one another and thus are topologically indistinct from one another. Likewise, some dendrimers contain successive onion skin-like layers or generations that have essentially the same chemical composition as one another and thus are compositionally indistinct from one another.

In some embodiments, a lumophore-functionalized nanoparticle can include a nanoparticle core functionalized with one or more blue light-emitting lumophores, one or more orange light-emitting lumophores, and/or one or more yellow light-emitting lumophores. A preferred embodiment provides a lumophore-functionalized nanoparticle that can include a nanoparticle core functionalized with blue light-emitting lumophores and an orange light-emitting lumophore. Another preferred embodiment provides a lumophore-functionalized nanoparticle that can include a nanoparticle core functionalized with blue light-emitting lumophores and a yellow light-emitting lumophore. Preferably, the lumophore-functionalized nanoparticle comprises a silsequioxane group of the Formula (VI) and/or of the Formula (VII).

(VI)

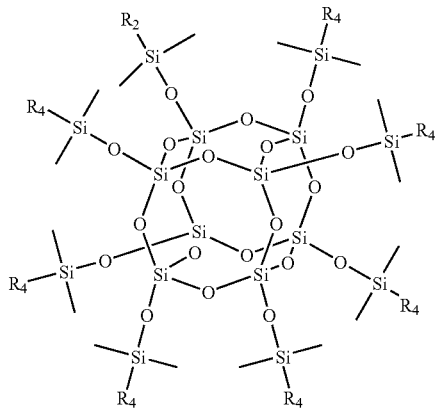

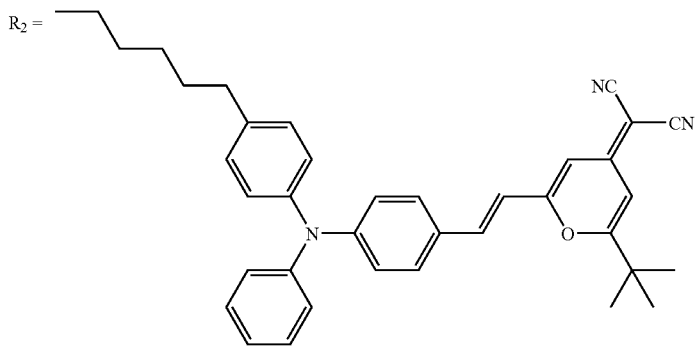

-continued
R₄ =
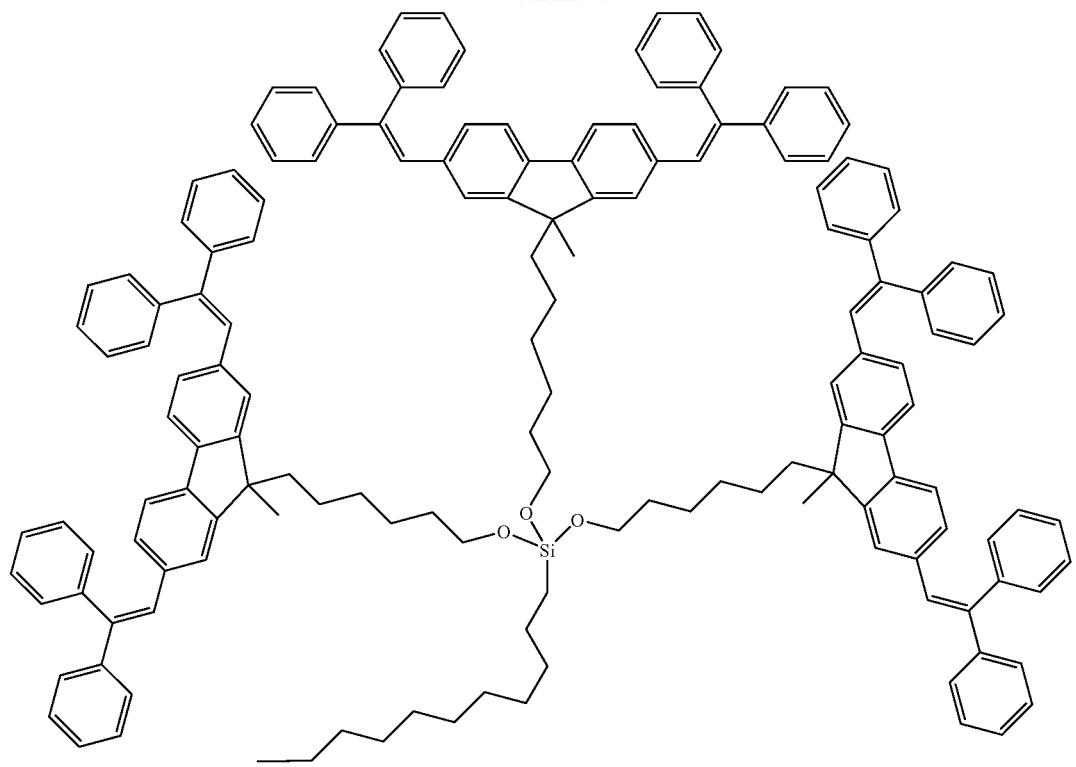
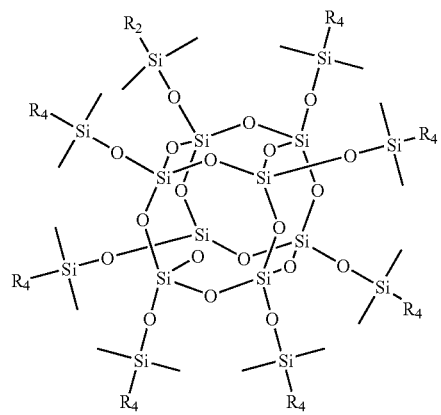
(VII)
R₂ =
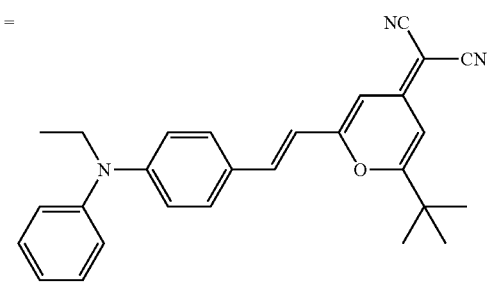

R4 =

-continued

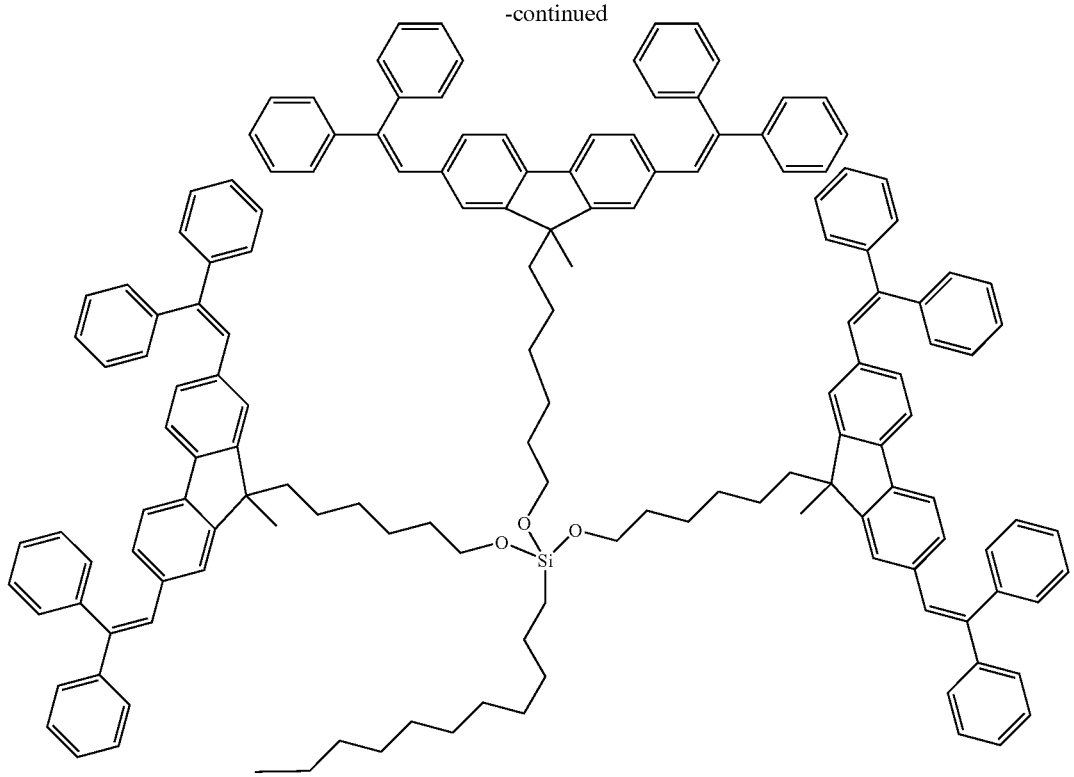

The Lumophore-Functionalized Nanoparticles Described Herein can be incorporated into light-emitting devices in various ways. For example, an embodiment provides a light-emitting device, comprising: an anode layer comprising a high work function metal; a cathode layer comprising a low work function metal; and a light-emitting layer positioned between, and electrically connected to, the anode layer and the cathode layer. The light-emitting layer comprising a lumophore-functionalized nanoparticle or composition thereof, as described herein. For example, in an embodiment, the light-emitting layer comprises an organic-inorganic lumophore-functionalized nanoparticles.

Light-emitting devices comprising lumophore-functionalized nanoparticles can be fabricated using techniques known in the art, as informed by the guidance provided herein. For example, a glass substrate can be coated with a high work functioning metal such as ITO which can act as an anode. After patterning the anode layer, a light-emitting composition layer that includes the lumophore-functionalized nanoparticles can be deposited on the anode by spin-coating. The light-emitting layer can further include a hole-transport material and/or electron-transport material which can be intermixed with the functionalized nanoparticles before deposition. The cathode layer, comprising a low work functioning metal (e.g., Mg:Ag), can then be vapor evaporated onto the light-emitting composition layer. If desired, the device can also include an electron transport/injection layer, a hole blocking layer and/or a hole injection layer that can be added to the device using techniques known in the art.

EXAMPLES

General: In the following examples, organic layers obtained after extractions were dried over $MgSO_4$. NMR spectra were recorded on a JOEL 400 MHz NMR spectrometer. All reactions were performed under Ar unless otherwise stated. Tetrahydrofuran (THF) and toluene were freshly distilled from Na/benzophenone prior to use. Other reagents were purchased from commercial sources (e.g., Aldrich) and used without further purification.

Figure 4:
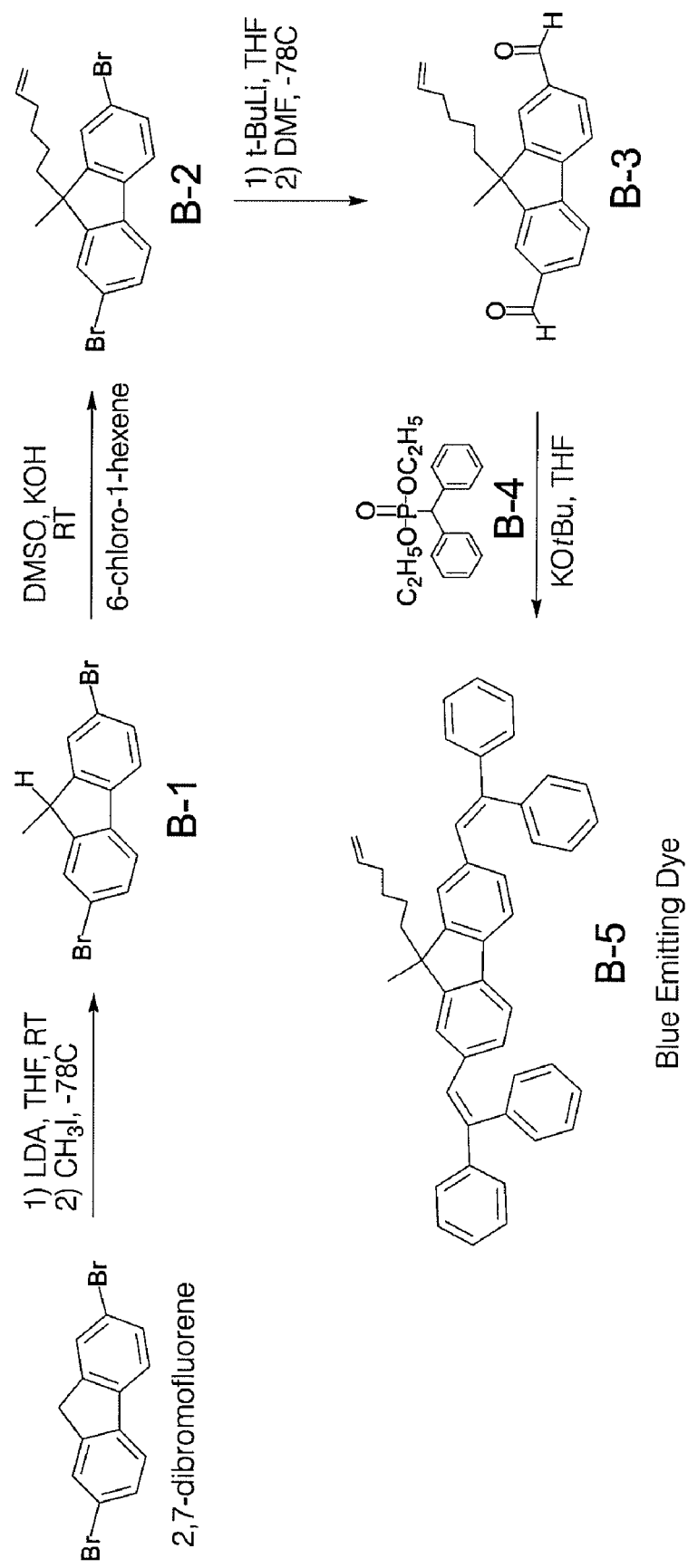
FIG. 4 illustrates a synthetic method for preparing a blue lumophore B-5.
Figure 5:
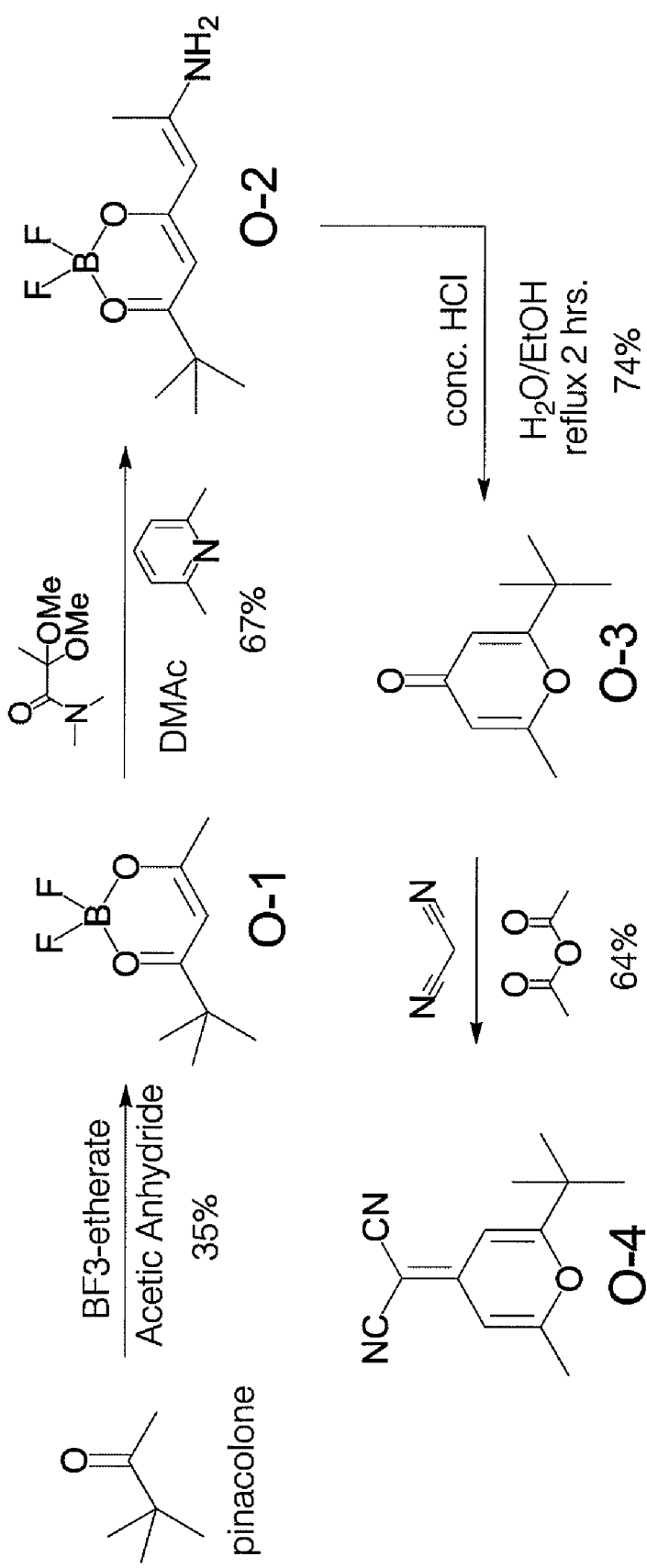
FIG. 5 illustrates a synthetic method for preparing an intermediate compound O-4 that can be used in the synthesis of lumophores.
Figure 6:
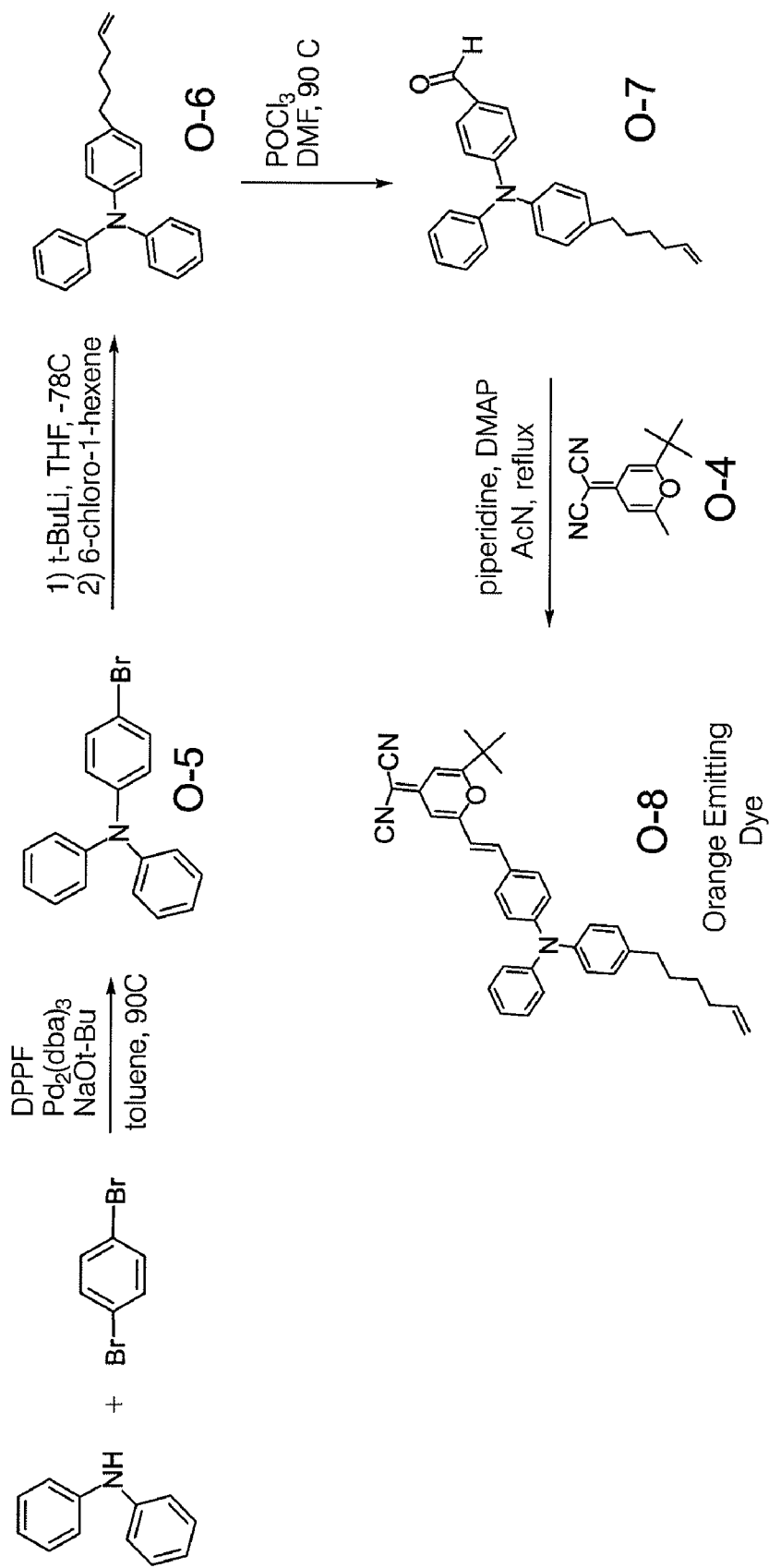
FIG. 6 illustrates a synthetic method for preparing an orange lumophore O-8.
Figure 7:
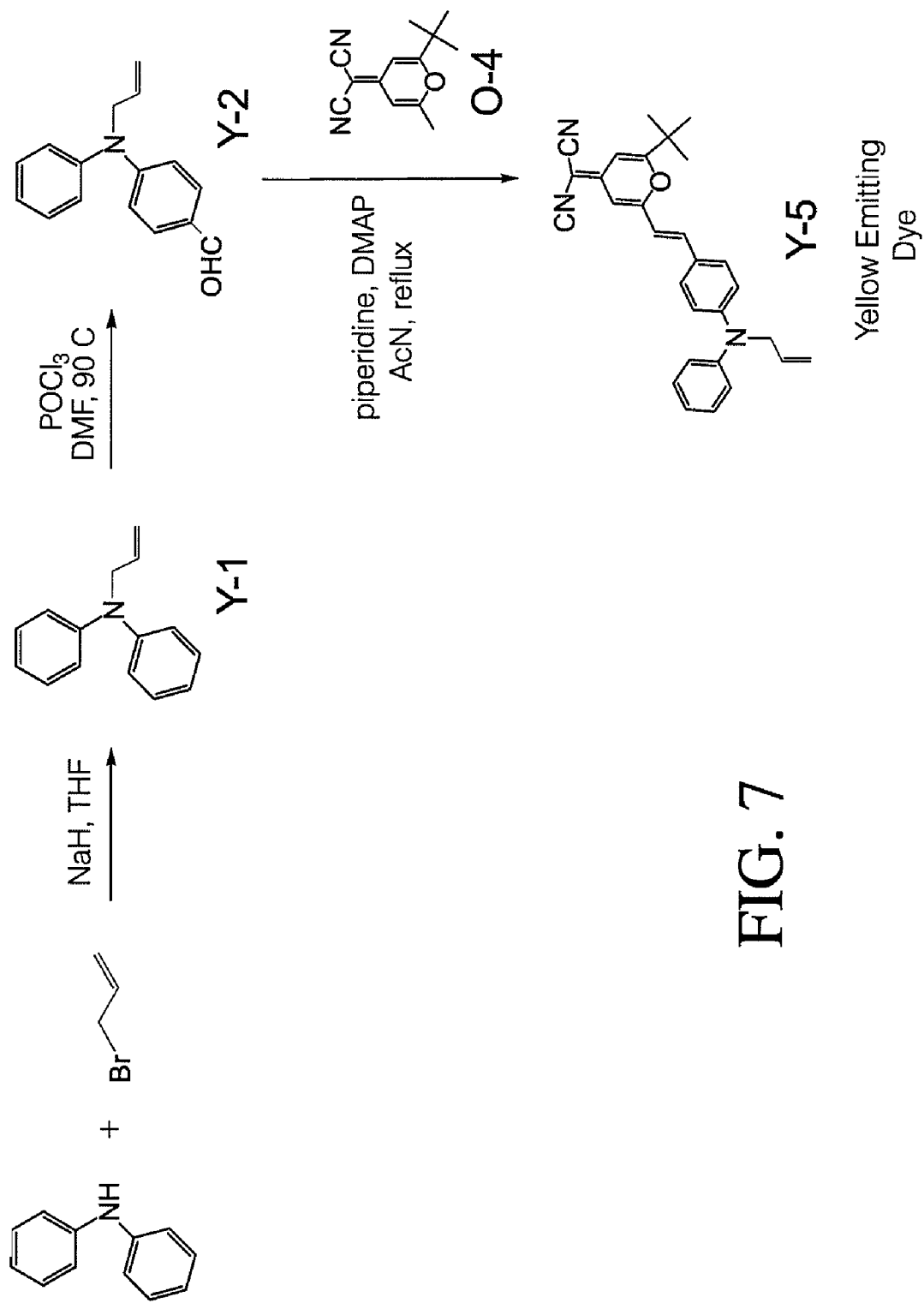
FIG. 7 illustrates a synthetic method for preparing a yellow lumophore Y-5.

The blue lumophore 9-hexenyl-2,7-bis-(2,2-diphenyl-vinyl)-9-methyl-fluorene (B-5) was prepared as illustrated in FIG. 4 and described in Examples 1-5 below. Other blue lumophores may be prepared similarly or by standard organic chemistry reactions and techniques. Red and orange lumophores may also be prepared by standard organic chemistry reactions and techniques, e.g., in the manner illustrated in FIGS. 5-6 and described in Examples 6-13 below for the preparation of the orange lumophore O-8. Yellow lumophores may also be prepared by standard organic chemistry reactions and techniques, e.g., in the manner illustrated in FIG. 7 and described in Examples 14-16 below for the preparation of the yellow lumophore Y-5. Other functionalized lumophores may be prepared similarly.

Red, blue, and/or yellow lumophores may be attached to nanoparticles to prepare light-emitting lumophore-functionalized nanoparticles using standard organic chemistry reactions and techniques. Preferably, the lumophores are attached to a silsequioxane core in the general manner described for the attachment of various groups to silsequioxane in PCT WO 02/05971. Exemplary methods for attaching lumophores to a nanoparticle core are illustrated in FIGS. 1-3 and 8-10 and described below in Examples 17-20. The fabrication of various light-emitting devices incorporating the light-emitting lumophore-functionalized nanoparticles is illustrated in FIGS. 11-18 and described below in Examples 21-27. Light emission by the light-emitting lumophore-functionalized nanoparticles and devices may be measured by the use of an integrating sphere or other technique known to those skilled in the art. Descriptions of measurement of color are provide in R. W. G. Hunt, Measuring Colour, Ellis Horwood Ltd, 1987 and in Douglas A. Skoog, F. James Holler, Timothy A. Nieman, Principles of Instrumental Analysis; Saunders College Publishing, Philadelphia, 1998, Ch. 15, both of which are hereby incorporated by reference in their entireties.

Example 1

Synthesis of B-1

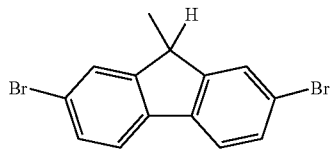

B-1

A clean, dry round bottom flask was charged with a stirbar, 2,7-dibromofluorene (25.25 g, 77.93 mmol), and freshly distilled THF (250 mL). The flask was fitted with a septum and argon was bubbled through the solution for 15 minutes. While maintaining positive argon pressure, the reaction mixture was cooled to −78° C. in a dry ice/acetone bath for 15 minutes. Lithium Diisopropyl Amide (LDA) (2.0 M in THF, 44.81 mL, 89.62 mmol) was added to the reaction mixture by syringe. The flask was then removed from the cold bath until it warmed to room temperature (RT) then it was placed in the −78° C. bath again. Once the reaction mixture was cooled back down to −78° C., excess $CH_3I$ (15 mL, 240 mmol) was added. The reaction mixture was stirred for 15 minutes then allowed to warm up to RT and remain at RT for 1 hour. The reaction mixture was then quenched by the addition of 2.5 mL acetic acid. After removing solvent by rotovap, the crude product was then purified by flash chromatography ($SiO_2$) using dichloromethane (DCM) as the elluent and recrystallized from hexanes to yield 24.21 g (92%) of the product B-1 as white needles.

Example 2

Synthesis of B-2

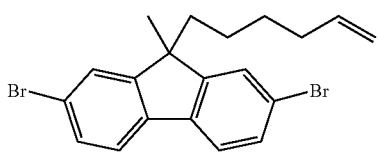

B-2

A clean, dry round bottom flask was charged with product B-1 (10.0 g, 29.59 mmol) and dry DMSO (100 mL). The solution was degassed by bubbling argon through it for 15 minutes. KOH (10 g, 177.5 mmol) and 6-chloro-1-hexene (23.4 mL, 177.5 mmol) were added to the flask and the reaction was stirred for 30 minutes at room temperature. The crude product was extracted with hexane/water and the hexane layer was washed with water 4x, collected and concentrated in vacuo. The residue was filtered through a silica plug using hexane as the elluent and the product was recrystallized from hexanes to yield 8.99 g (72%) of the product B-2 as an off white solid.

Example 3

Synthesis of B-3

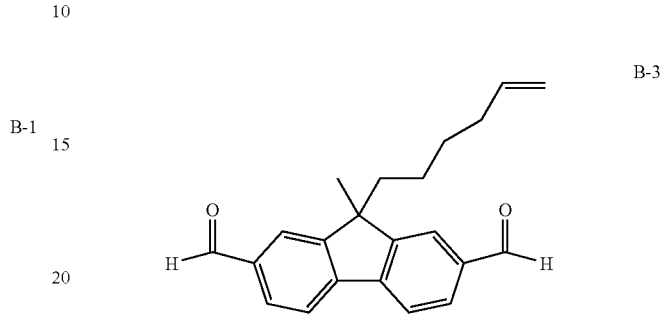

B-3

A round bottom flask was charged with product B-2 (8.38 g, 19.95 mmol) and dry THF (100 mL). The solution was degassed by bubbling argon through it for 15 minutes. The reaction mixture was cooled to −78° C. in a dry ice/acetone bath. Tert-butyllithium (1.7 M in pentane, 46.9 mL, 79.80 mmol) was added drop wise to reaction flask. The flask was stirred at −78° C. for 30 minutes and then allowed to warm up to room temperature for 3 hours. The flask was then cooled back down to −78° C. and dry DMF (12.3 mL, 159.62 mmol) was added. The flask was then allowed to warm up to room temperature for 1 hour. The reaction mixture was then poured into water and extracted with EtOAc. The EtOAc layer washed 5x with acidic water. The EtOAc was evaporated in vacuo and the residue was chromatographed with 3:2 DCM:hexane to yield 3.50 g (55%) of the product B-3 as a yellow oil.

Example 4

Synthesis of B-4

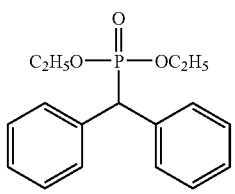

B-4

A round bottom flask was charged with chlorodiphenylmethane (15 g, 13.2 mL, 74.0 mmol) and triethyl phosphite (98.4 g, 103 mL 592 mmol) and refluxed overnight. The excess $P(OEt)_3$ and ethyl chloride (byproducts) were removed by distillation. The reaction mixture was then further purified by chromatography using 1:1 DCM:Hexanes to elude the chlorodiphenyl methane and 1:9 acetone:DCM to elude the product as a clear oil. The product was then recrystallized from hexanes to yield 8.32 g (37%) of the product B-4 as white needles.

Example 5

Synthesis of B-5

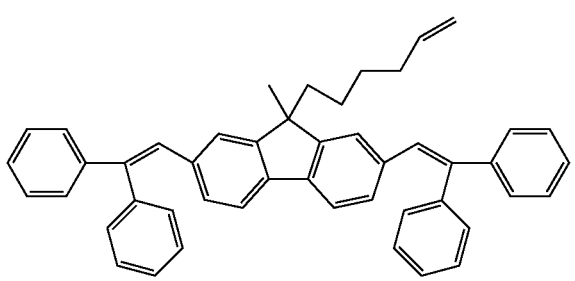

B-5

A dry, round bottom flask was charged with benzhydrylphosphonic acid diethyl ester (the product B-4) (7.86 g, 25.87 mmol), potassium tert-butoxide (3.48 g 31.04 mmol) and dry THF (50 mL). The solution was degassed by bubbling argon through it for 15 minutes. Meanwhile 9-(5-hexenyl)-9-methyl-2,7-formylfluorene (the product B-3) (3.29 g, 10.35 mmol) was added to another round bottom flask, dissolved in 50 ml dry THF and the solution was degassed with argon for 15 min. The solution containing B-3 was then cannulated into the round bottom flask containing B-4 and potassium tert-butoxide. The final solution was allowed to stir at room temperature for 3 hours. The THF was then evaporated in vacuo and the residue was dissolved in EtOAc. The EtOAc layer washed with water 4× and brine and dried over MgSO4. After flash chromatography (SiO$_2$) using 1:4 DCM:hexane, the collected product was then recrystallized from EtOH to yield 4.86 g (76%) of the product B-5 as a yellow micro crystal.

Example 6

Synthesis of O-1

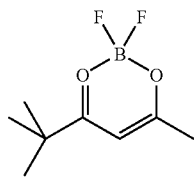

O-1

To a solution of pinacolone (69.0 ml, 555 mmol) in BF$_3$-diethyl etherate (0.95 eq., 74.8 g, 66.8 mL) that is cooled to 0° C., acetic anhydride (2 eq., 113.3 g, 104 ml) was added dropwise over the course of 30 min. The reaction was stirred overnight at RT, and then vacuum distilled at 90-95° C. Then, 3×2 L of hexane was added to the resulting tar and heated to a boil and decanted. The combined hexane extractions were condensed, which after plug filtration, was crystallized from hexane to yield 35.1 g (35%) of product O-1 as light yellow crystals.

Example 7

Synthesis of O-2

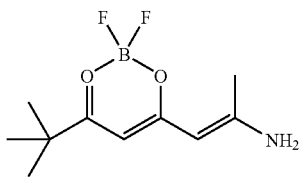

O-2

A solution of O-1 (35.1 g, 185 mmol), 2,6-leutidine (0.076 eq., 1.51 g), in N,N-dimethylacetamide (35 ml) was heated to 60° C. Dimethylacetamide dimethyl acetal (1.48 eq., 40 ml) was then added dropwise. After stirring the solution at 85° C. for 3 hours, it was cooled to RT, and then it was placed in dry-ice for 5 min to facilitate crystallization. Orange crystals were collected, and recrystallized from acetone to yield 28.45 g (67%) of product O-2 as a pastel orange solid.

Example 8

Synthesis of O-3

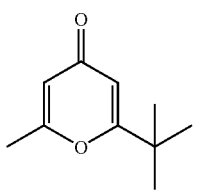

O-3

To a solution of O-2 (28.45 g, 123 mmol) in ethanol (525 ml) and water (50 ml), conc. HCl (34.6 ml, 346 mmol) was added dropwise at RT. Then, the solution was stirred at 90° C. for 3 hours. The solvent was evaporated and made alkaline by adding water followed by ammonium hydroxide, and then the product was extracted into ether. After evaporation, the product was then crystallized from hexane to yield 15.08 g (74%) of the product O-3 as a yellow translucent solid.

Example 9

Synthesis of O-4

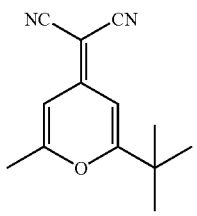

O-4

A solution of O-3 (15.08 g, 90.7 mmol), malononitrile (7.26 g, 110 mmol), in acetic anhydride (38.2 ml) was stirred at 120° C. for 6 hours. Then the excess acetic anhydride/acid was vacuum distilled off until the reaction flask was nearly dry. Ethanol was added to the sludgy reaction mixture and heated to a boil. After cooling, the crude product precipitates. The product was filtered, and recrystallized from ethanol to yield 12.37 g (64%) of the product O-4 as a peachy fibrous solid.

Example 10

Synthesis of O-1

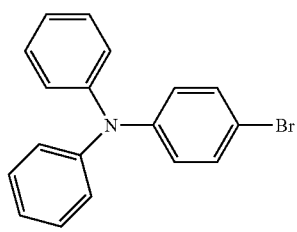

O-5

A clean, dry round bottom flask was charged with a stirbar, diphenylamine (10.0 g, 59.2 mmol), 1,4-dibromobenzene (20 g, 84.7 mmol), and dry toluene (300 mL). The solution was degassed for 10 minutes by argon followed by the addition of $Pd_2(dba)_3$ (tris(dibenzylideneacetone) dipalladium) (405 mg, 0.443 mmol), DPPF (1,1'-bis(diphenylphosphino) ferrocene) (735 mg, 1.33 mmol) and sodium tert-butoxide (17.0 g, 177 mmol). The reaction mixture was then stirred at 90° C. overnight under positive argon pressure. The reaction mixture was then filtered and the toluene was evaporated in vacuo. The product was chromatographed using hexanes and dried to yield 11.67 g (61%) of the product O-5 as a white microcrystal.

Example 11

Synthesis of O-6

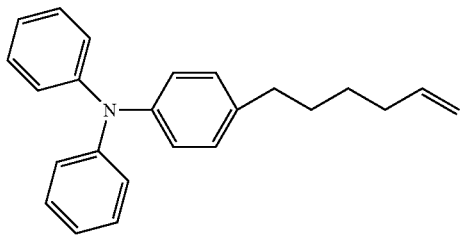

O-6

A clean, dry round bottom flask was charged with a stirbar, the product O-5 (10.0 g, 30.9 mmol) and freshly distilled THF (100 ml). The solution was degassed for 15 minutes with argon and then cooled to −78° C. in a dry ice/acetone bath under positive argon pressure. Tert-butyllithium (36.3 ml, 1.70M solution in pentane, 61.7 mmol) was added via syringe and the reaction mixture was stirred at −78° C. for 30 minutes. 6-chloro-1-hexene was then added and the reaction mixture was stirred at −78° C. for 15 minutes and then allowed to warm up to room temperature. The reaction mixture was then heated to 50° C. overnight. The THF was evaporated in vacuo and the residue dissolved in EtOAc and washed with water. The product was chromoatographed using hexanes to yield 4.22 g (42%) of the product O-6 as a clear oil.

Example 12

Synthesis of O-7

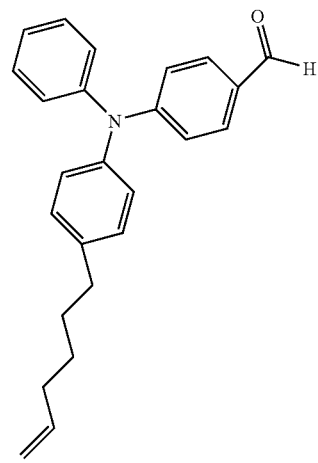

O-7

A clean, dry round bottom flask was charged with a stirbar, the product O-6 (1.05 g, 3.21 mmol) and DMF (7.5 ml, 103 mmol). $POCl_3$ (0.45 ml, 4.82 mmol) was added and the reaction mixture was stirred at 90° C. for 3 hours. The reaction mixture was poured into water and product was extracted into EtOAc. The EtOAc layer was rinsed with water 2× and evaporated in vacuo. The product was then chromatographed using 3:2 DCM:hexanes to yield 860 mg (75%) of the product O-7 as a yellow oil.

Example 13

Synthesis of O-8

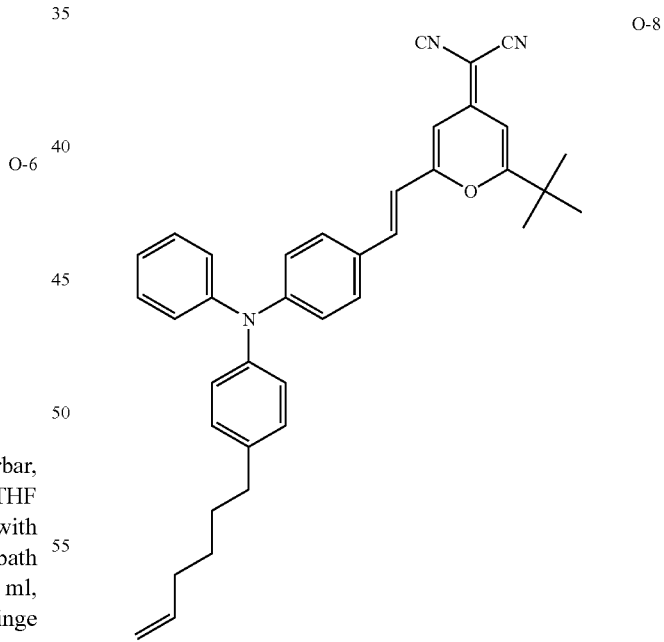

O-8

A clean, dry round bottom flask was charged with a stirbar, the product O-7 (860 mg, 2.42 mmol), the product O-4 (518 mg, 2.42 mmol), 4-(dimethylamino)-pyridine (DMAP) (59 mg, 0.49 mmol), piperidine (0.5 ml, 4.9 mmol) and dry acetonitrile (25 ml). The solution was refluxed overnight. The acetonitrile was evaporated in vacuo and the product was chromatographed in 1:9 EtOAc:hexanes and recrystallized from MeOH to yield 496 mg (37%) of the product O-8 as dark red needle like crystals.

Example 14

Synthesis of Y-1

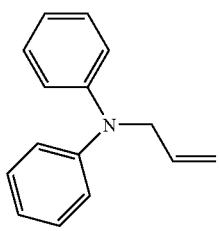

A clean, dry round bottom flask was charged with a stirbar, diphenylamine (16.9 g, 0.1 mol) and freshly distilled THF (100 ml). The solution was degassed for 15 minutes with argon and then cooled to 0° C. under positive argon flow. NaH (2.4 g, 0.1 mol) was added portionwise and the reaction mixture was stirred at 0° C. for 10 minutes. Ally bromide (12.1 g, 0.1 mol) was then dropwise added through a syringe and the reaction mixture was stirred at 0° C. for 15 minutes and then allowed to warm up to room temperature. The reaction mixture was then heated to 50° C. overnight. The THF was evaporated in vacuo and the residue dissolved in EtOAc and washed with water. The product was chromatographed using DCM/hexanes(1/1) to yield 14.2 g (70%) of the product Y-1 as an off-white solid.

Example 15

Synthesis of Y-2

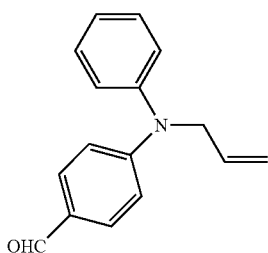

A clean, dry round bottom flask was charged with a stirbar, the product Y-1 (6.27 g, 30 mmol) and DMF (75 ml). POCl$_3$ (4.5 ml, 48.2 mmol) was added and the reaction mixture was stirred at 90° C. for 3 hours. The reaction mixture was poured into water and product was extracted into EtOAc. The EtOAc layer was rinsed with water 2 times and evaporated in vacuo. The product was then chromatographed using 3:2 DCM:hexanes to yield 5.3 g (75%) of the product Y-2 as a white solid.

Example 16

Synthesis of Y-5

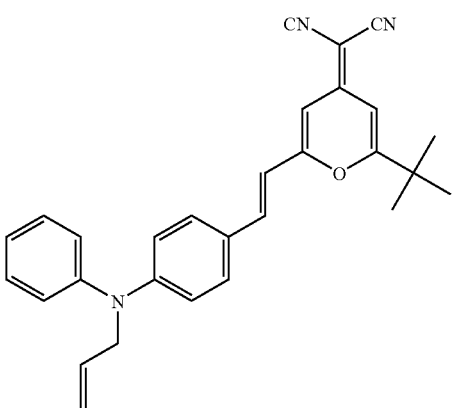

A clean, dry round bottom flask was charged with a stirbar, the product Y-2 (570 mg, 2.42 mmol), the product O-4 (518 mg, 2.42 mmol), 4-(dimethylamino)-pyridine (DMAP) (59 mg, 0.49 mmol), piperidine (0.5 ml, 4.9 mmol) and dry acetonitrile (25 ml). The solution was refluxed overnight. The acetonitrile was evaporated in vacuo and the product was chromatographed in 1:9 EtOAc:hexanes and recrystallized from MeOH to yield 540 mg (52%) of the product Y-5 as dark red sheet-like solid.

Example 17

Synthesis of POSS-(Blue)$_8$

Figure 8:
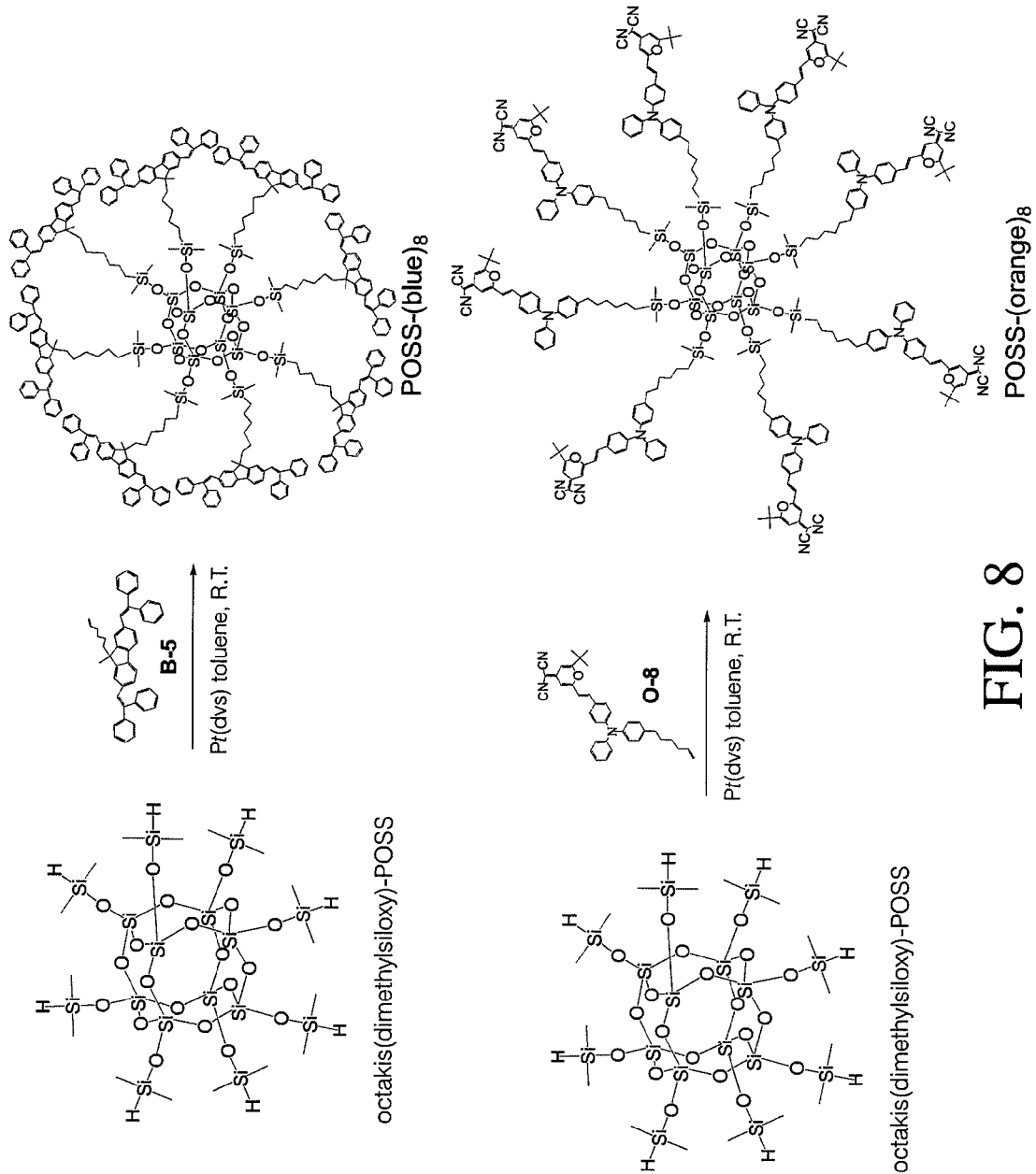
FIG. 8 illustrates synthetic methods for preparing lumophore-functionalized nanoparticles, POSS-(blue)$_8$ and POSS-(orange)$_8$.

The general synthesis of POSS-(blue)$_8$ is shown in FIG. 8. A clean, dry round bottom flask was charged with a stirbar, 1,3,5,7,9,11,13,15-octakis(dimethylsilyloxy)pentacyclo-[9.5.1.1$^{3,9}$.1$^{5,15}$.1$^{7,13}$]-octasiloxane (octakis(dimethylsiloxy)-POSS) (340 mg, 0.334 mmol), the product B-5 (1.65 g, 2.67 mmol), and dry toluene (5 ml). Pt(dvs) (platinum-divinyl tetramethyldisiloxane complex) (0.05 ml, 2% Pt wt. solution in xylene) was added and the reaction mixture was stirred at room temperature under positive argon pressure for 2 hours. The toluene was evaporated in vacuo and POSS-(blue)$_8$ was separated chromatographically using 3:2 DCM:hexanes to yield 1.16 g (60%).

Example 18

Synthesis of POSS-(Orange)$_8$

The general synthesis of POSS-(orange)$_8$ is shown in FIG. 8. A clean, dry round bottom flask was charged with a stirbar, 1,3,5,7,9,11,13,15-octakis(dimethylsilyloxy)pentacyclo-[9.5.1.1$^{3,9}$.1$^{5,15}$.1$^{7,13}$]-octasiloxane (340 mg, 0.334 mmol), the product O-8 (1.84 g, 3.34 mmol), and dry toluene (5 ml). Pt(dvs) (platinum-divinyl tetramethyldisiloxane complex) (0.05 ml, 2% Pt wt. solution in xylene) was added and the reaction mixture was stirred at room temperature under positive argon pressure for 2 hours. The toluene was evaporated in vacuo and POSS-(orange)$_8$ was separated chromatographically using 3% ethyl acetate in DCM to yield 1.36 g (75%).

Example 19

Synthesis of POSS-(Blue)$_{21}$(Orange)$_1$

Figure 9:
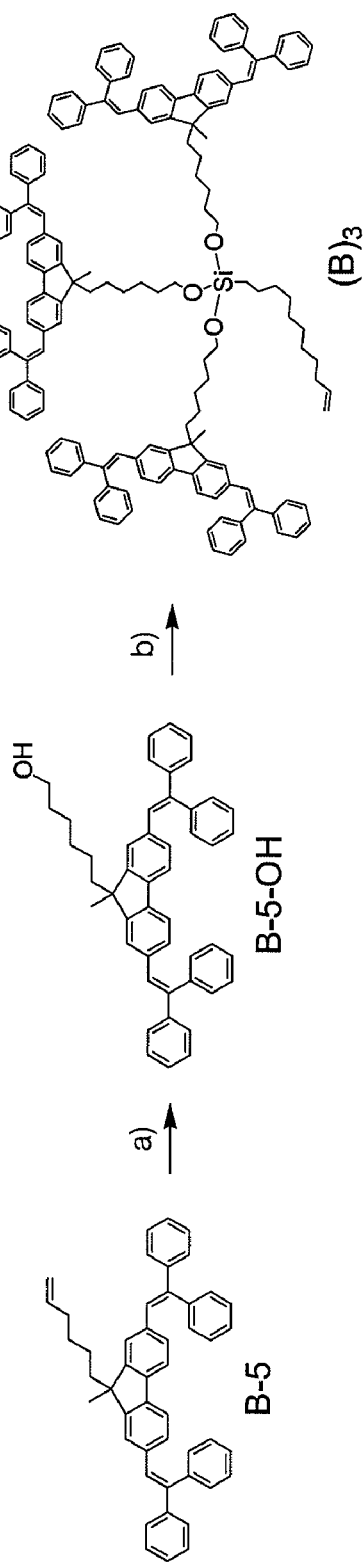
FIG. 9 illustrates a synthetic method for preparing a POSS (blue)$_{21}$(orange)$_1$ lumophore-functionalized nanoparticle.
Figure 9:
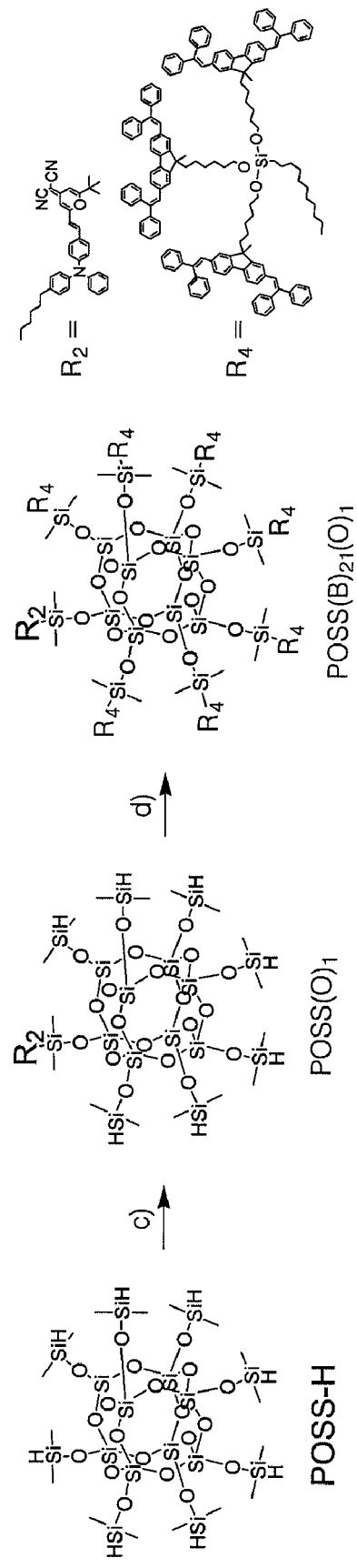

The general synthesis of POSS-(blue)$_{21}$(orange)$_1$ is shown in FIG. 9.

Synthesis of B-5-OH: A dry, round bottom flask was charged with B-5 (2.83 g, 4.57 mmol) and THF (50 ml). 9-BBN (0.5 M in THF, 9.1 ml, 4.57 mmol) was added slowly and the reaction mixture was allowed to stir overnight. The reaction mixture was cooled to 0° C., a 3M NaOH (0.37 g, 9.14 mmol) solution in water was added into the reaction. After stirring for 5 min, H$_2$O$_2$ (30% wt in water, 0.44 mL, 4.57 mmol) was slowly added to the reaction mixture. After addition was complete, the reaction mixture was allowed to warm to 50° C. and left to stir overnight. The solution was evaporated in vacuo. The crude product was filtered through silica using 1:4 dichloromethane:hexanes to recover the starting material B-5. and the product B-5-OH was eluded using 100% dichloromethane to yield 1.72 g (59%) as a yellow solid.

Synthesis of (B)$_3$: A dry round bottom flask was charged with B-5-OH (4.20 g, 6.60 mmol), imidazole (0.700 g, 10.3 mmol) and anhydrous dichloromethane (50 mL). Freshly distilled 10-undecenyltrichlorosilane (0.57 mL, 2.06 mmol) was added via a syringe and the reaction mixture was stirred overnight. The reaction mixture was concentrated in vacuo and then filtered through silica using 1:1 dichloromethane:hexanes. The product was then dissolved in a minimal amount of tetrahydrofuran and precipitated out of stirring methanol. The methanol was removed and 4.21 g (92%) of product (B)$_3$ was obtained as a yellow solid.

Synthesis of POSS(Blue)$_{21}$(Orange)$_1$: A clean, dry round bottom flask was charged with a stirbar, octakis(dimethylsiloxy)-POSS (24 mg, 0.024 mmol), O-8 (16 mg, 0.029 mmol), and toluene (2 ml). Pt2(dvs)3 (platinum-divinyl tetramethyldisiloxane complex) (0.005 ml, 2% Pt wt. solution in xylene) was introduced through a syringe and the reaction mixture was stirred at room temperature under positive argon pressure for 30 minutes. In another round bottom flask, a solution of (B)$_3$ (5.06 mg, 0.242 mmol) and 0.005 ml of Pt2(dvs)3 in toluene (5 ml) was made. The solution containing POSS and O-8 was then cannulated into the solution containing (B)$_3$ and the resulting reaction mixture was allowed to stir at room temperature overnight. The toluene was evaporated in vacuo and the product POSS(Blue)$_{21}$(Orange)$_1$ was separated chromatographically using 3:2 DCM:hexanes. The product was further purified by Prep TLC using 3:2 DCM:hexanes to yield 40 mg (10%).

Example 20

Synthesis of POSS-(Blue)$_{21}$(Yellow)$_1$

Figure 10:
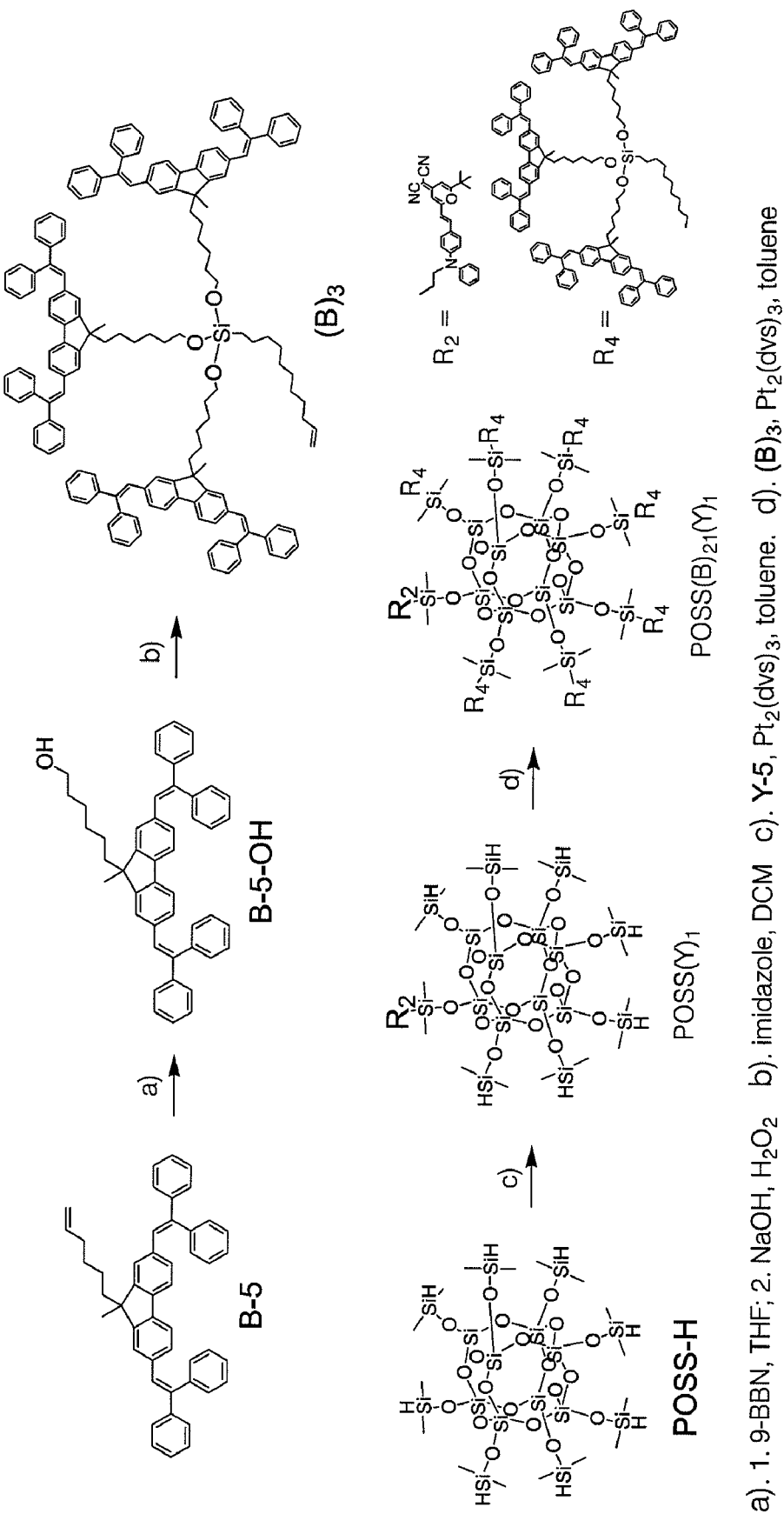
FIG. 10 illustrates a synthetic method for preparing a POSS (blue)$_{21}$(yellow)$_1$ lumophore-functionalized nanoparticle.

The general synthesis of POSS-(blue)$_{21}$(yellow)$_1$ is shown in FIG. 10.

Synthesis of POSS(Blue)$_{21}$(Yellow)$_1$: A clean, dry round bottom flask was charged with a stirbar, octakis(dimethylsiloxy)-POSS (24 mg, 0.024 mmol), Y-5 (12 mg, 0.028 mmol), and toluene (2 ml). Pt2(dvs)3 (platinum-divinyl tetramethyldisiloxane complex) (0.005 ml, 2% Pt wt. solution in xylene) was introduced through a syringe and the reaction mixture was stirred at room temperature under positive argon pressure for 30 minutes. In another round bottom flask, a solution of (B)$_3$ (5.06 mg, 0.242 mmol) and 0.005 ml of Pt2(dvs)3 in toluene (5 ml) was made. The solution containing POSS and Y-5 was then cannulated into the solution containing (B)$_3$ and the resulting reaction mixture was allowed to stir at room temperature overnight. The toluene was evaporated in vacuo and the product POSS(Blue)$_{21}$(Yellow)$_1$ was separated chromatographically using 3:2 DCM:hexanes. The product was further purified by Prep TLC using 3:2 DCM:hexanes to yield 40 mg (10%).

Example 21

Fabrication of light-emitting device 90 (FIG. 11): A glass substrate was coated with 100-200 nm of ITO. The ITO coated substrate was cut into 1 inch square pieces and cleaned using consecutive ultrasonic baths of acetone, methanol, and isopropanol. The ITO anode was patterned either with a thick silicon oxide insulating layer or by etching the ITO with an acid bath to form the ITO anode/glass substrate layer 92. After patterning, the same cleaning procedure was implemented again followed by RF assisted plasma ashing for approximately 2 minutes. A light-emitting layer 91, comprising POSS(blue)$_8$+POSS(orange)$_8$ (weight ratio 750:1) without a host material, was deposited on top of the ITO anode/glass substrate layer 92 by spin-coating at 1000 rpm from a 15 mg/mL solution of POSS(blue)$_8$+POSS(orange)$_8$ in chloroform, and dried at 70-100° C. in a nitrogen glovebox. The thickness of the resulting light-emitting layer 91 was 1200-1300 Å as measured by stylus profilometry. A 3300 Å cathode layer 93, comprising Mg:Ag (10:1), was then vapor evaporated onto the surface of the light-emitting layer 91 at a pressure of 2×10$^{-6}$ Torr to produce the light-emitting device 90 with an active area of 0.1 cm$^2$.

Figure 11:
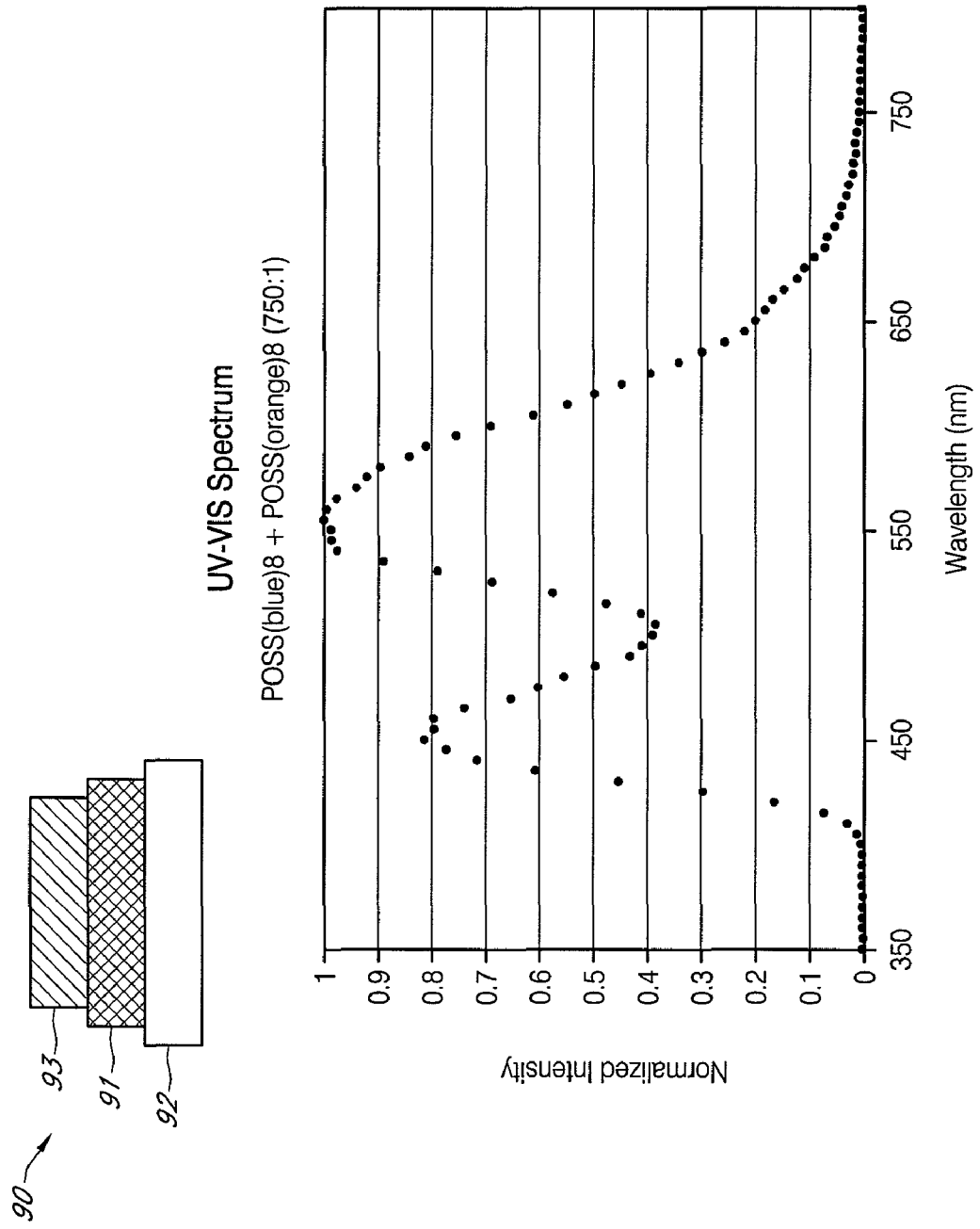
FIG. 11 schematically illustrates a light emitting device 90 that includes a light-emitting layer emitting layer 91 (containing lumophore-functionalized nanoparticles, POSS(blue)$_8$ and POSS(orange)$_8$, in the ratio of 750:1 POSS(blue)$_8$:POSS (orange)$_8$), positioned between an ITO anode/glass substrate layer 92 and a Mg:Ag cathode layer 93.

FIG. 11 shows a UV-VIS spectrum of the light emitted by the light-emitting device 90. Although the number of POSS (blue)$_8$ nanoparticles is greater than the number of POSS (orange)$_8$ nanoparticles (ratio=approximately 750:1), the orange light intensity (~560 nm) is almost equal to the blue light intensity (~450 nm), possibly due to the strong intermolecular energy transfer, as shown in FIG. 11. As a result, the light-emitting device 90 emits white light.

Example 22

Fabrication of light-emitting device 100 (FIG. 12): A glass substrate was coated with 100-200 nm of ITO. The ITO coated substrate was cut into 1 inch square pieces and cleaned using consecutive ultrasonic baths of acetone, methanol, and isopropanol. The ITO anode was patterned either with a thick silicon oxide insulating layer or by etching the ITO with an acid bath to form the ITO anode/glass substrate layer 102. After patterning, the same cleaning procedure was implemented again followed by RF assisted plasma ashing for approximately 2 minutes. A light-emitting layer 101, comprising a host material and lumophore-functionalized nanoparticles, was deposited on top of the ITO anode/glass substrate layer 102 by spin-coating at 1000 rpm from a 15 mg/mL solution of the host material and nanoparticles in chloroform, and dried at 70-100° C. in a nitrogen glovebox. The host material was poly(N-vinylcarbazole) (PVK, 49.5% by weight based on total) and 2-(4-biphenyl)-5-(4-tert-butylphenyl)-1,3,4-oxadiazole (PBD, 49.5% by weight based on total), and the nanoparticles were POSS(blue)$_8$ and POSS(orange)$_8$ (together 1% by weight based on total, weight ratio 7:1 of POSS(blue)$_8$ to POSS(orange)$_8$). The thickness of the resulting light-emitting layer 101 was 1200-1300 Å as measured by stylus profilometry. A 3300 Å cathode layer 103, comprising Mg:Ag (10:1), was then vapor evaporated onto the surface of light-emitting layer 101 at a pressure of $2 \times 10^{-6}$ Torr to produce the light-emitting device 100 with an active area of 0.1 cm$^2$.

Figure 12:
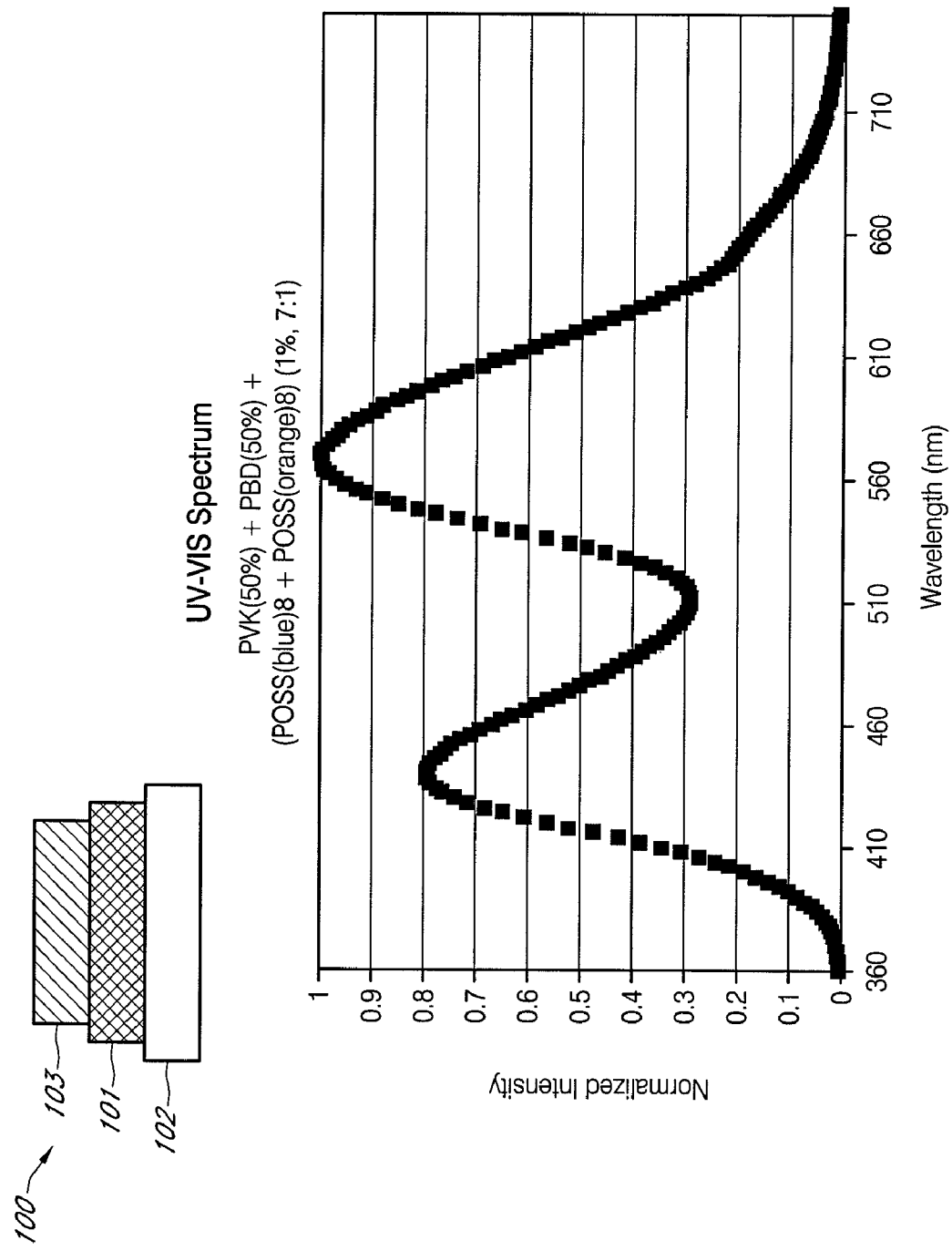
FIG. 12 schematically illustrates a light emitting device 100 that includes a light-emitting layer emitting layer 101 (containing PVK+PBD (50:50) and lumophore-functionalized nanoparticles, POSS(blue)$_8$ and POSS(orange)$_8$, in the ratio of 7:1 POSS(blue)$_8$:POSS(orange)$_8$), positioned between an ITO anode/glass substrate layer 102 and a Mg:Ag cathode layer 103.
Figure 13:
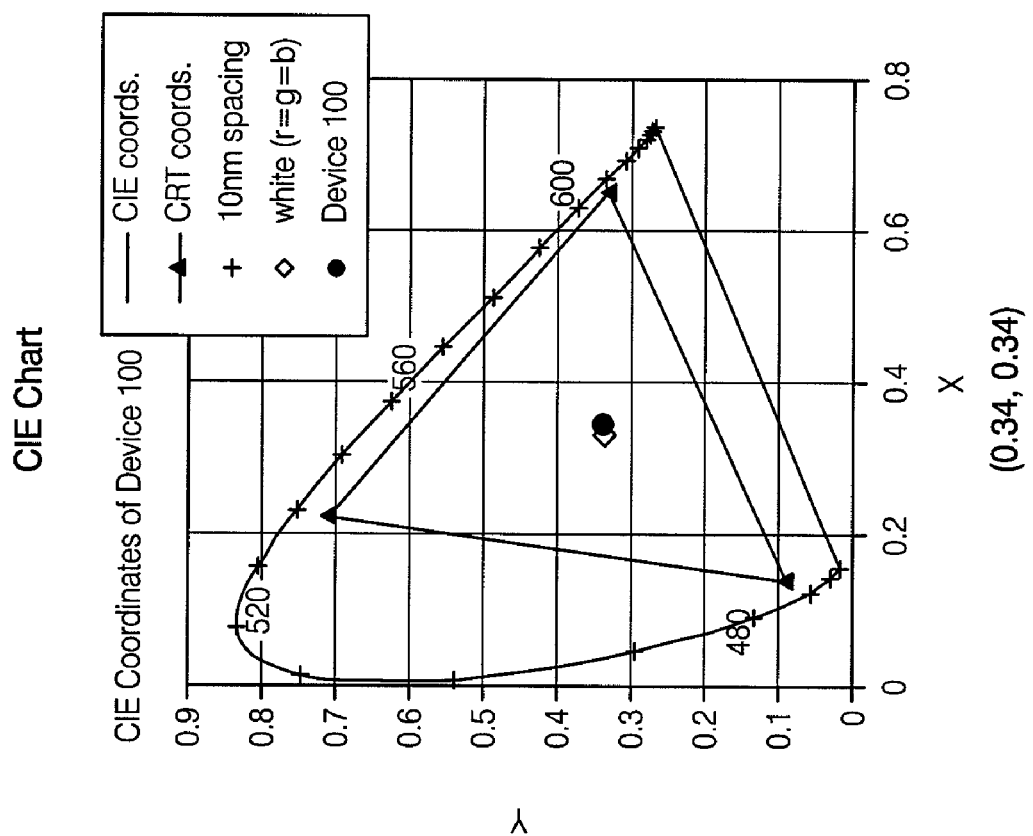
FIG. 13 illustrates a 2-dimensional CIE color coordinate diagram for the light that is emitted by the device 100 that is illustrated in FIG. 12.

FIG. 12 shows a UV-VIS spectrum of the light emitted by the light-emitting device 100, in which the light emitting layer 101 contains the host material. As shown in FIG. 12, when the ratio of the number of POSS(blue)$_8$ to POSS(orange)$_8$ nanoparticles reaches approximately 7:1, the orange light intensity (~560 nm) is almost equal to the blue light intensity (~450 nm). Additionally, the light-emitting device emits white light (X=0.34, Y=0.34, as indicated in the CIE chart shown in FIG. 13).

Example 23

Single Layer LED Device with POSS-(Blue)$_{21}$(Orange)$_1$

A light emitting device was fabricated in the manner described in Example 22 above, except that the light-emitting layer 101 contained POSS-(blue)$_{21}$(orange)$_1$ nanoparticles in place of the POSS(blue)$_8$ and POSS(orange)$_8$ nanoparticles described in Example 22.

Example 24

Single Layer LED Device with POSS-(Blue)$_{21}$(Yellow)$_1$

A light emitting device was fabricated in the manner described in Example 22 above, except that the light-emitting layer 101 contained POSS-(blue)$_{21}$(yellow)$_1$ nanoparticles in place of the POSS(blue)$_8$ and POSS(orange)$_8$ nanoparticles described in Example 22.

Figure 14:
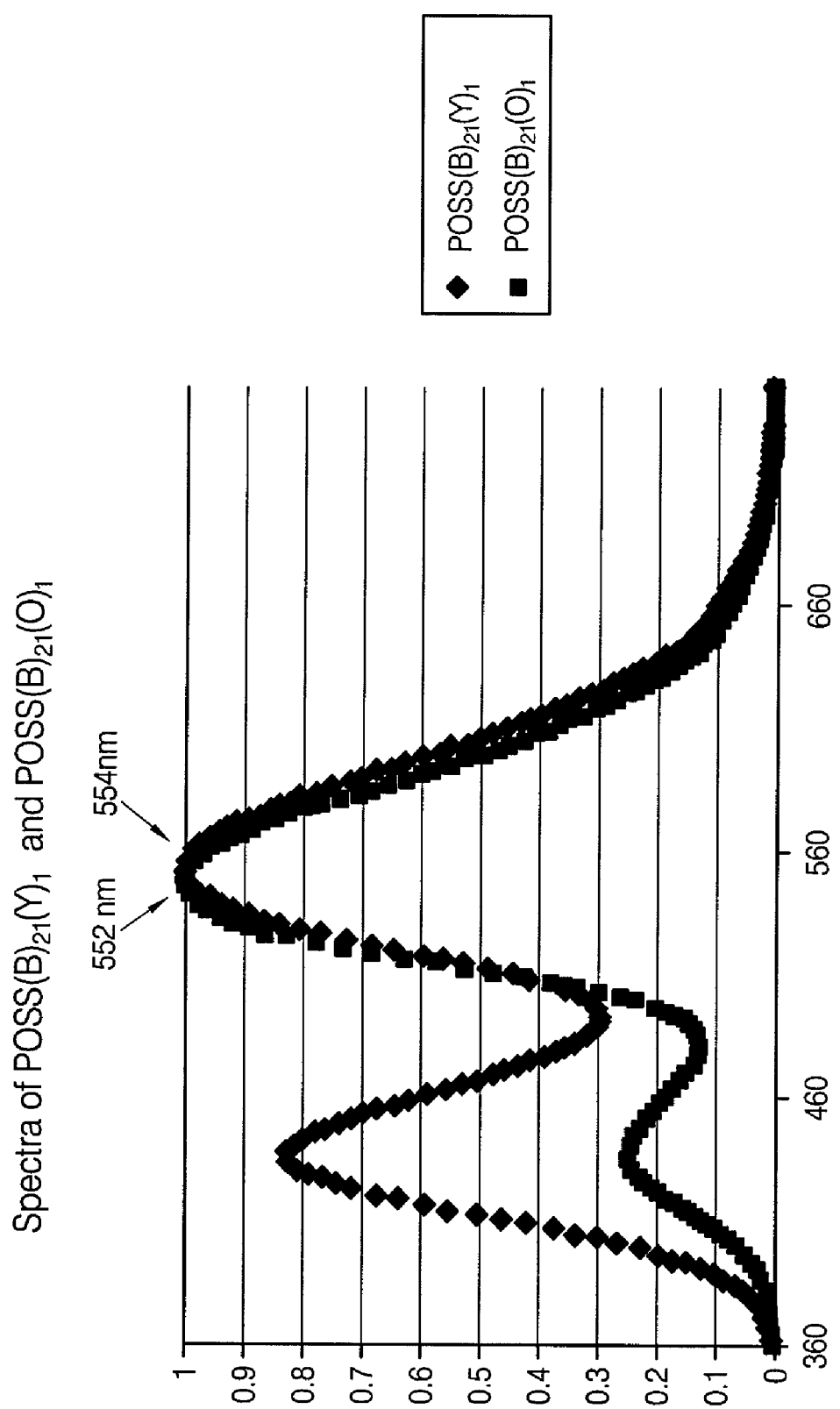
FIG. 14 illustrates UV-VIS spectra of the light emitted by the light-emitting device of Example 23 (incorporates lumophore-functionalized nanoparticles, POSS(blue)$_{21}$(orange)$_1$ denoted with (■)) and Example 24 (incorporates lumophore-functionalized nanoparticles, POSS(blue)$_{21}$(yellow)$_1$ denoted with (♦)).
Figure 15B:
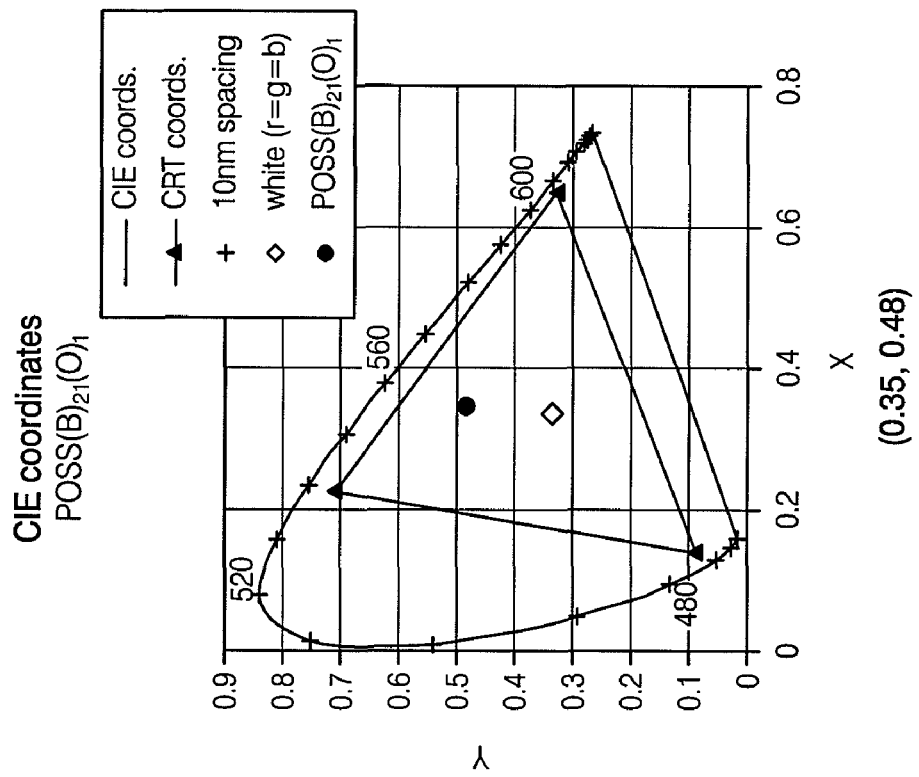
FIGS. 15A and 15B illustrate general 2-dimensional CIE color coordinate diagrams for the light that is emitted by the devices of Examples 24 and 23, respectively. The white color can be obtained at coordinates near X=0.33 and Y=0.33.
Figure 15A:
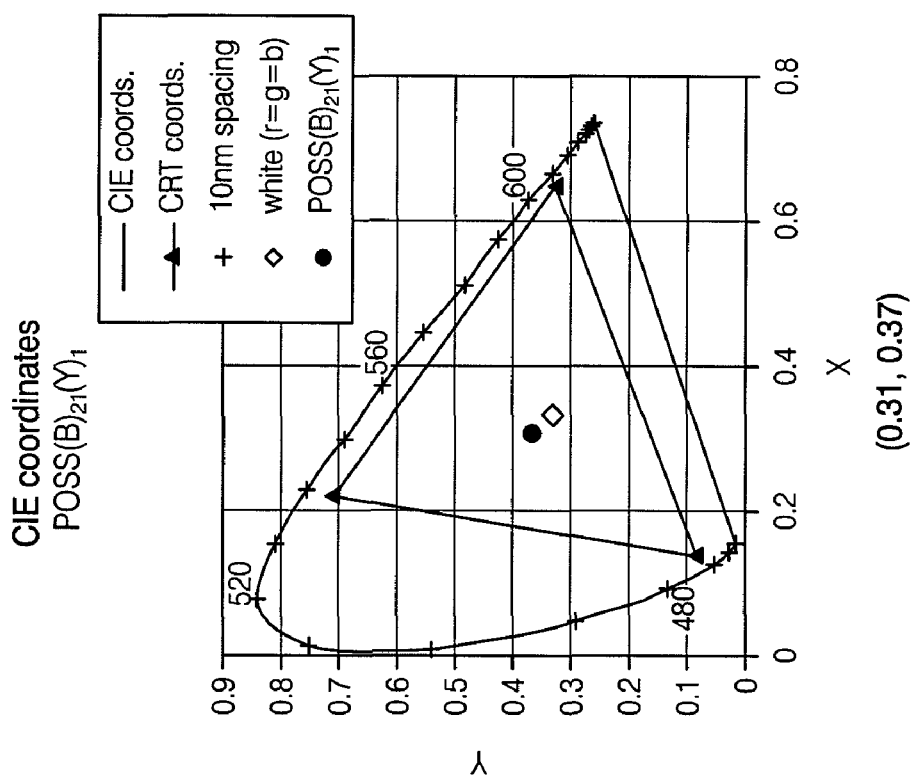
Figure 16:
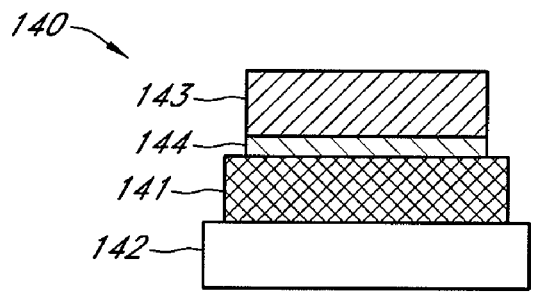
FIG. 16 illustrates a light-emitting device 140, which includes a light-emitting layer emitting layer 141 (containing lumophore-functionalized nanoparticles) positioned between an anode/glass substrate layer 142 and a cathode layer 143. The device 140 also includes an electron transport/injection layer 144 positioned between the cathode layer 143 and the light emitting layer 141.
Figure 17:
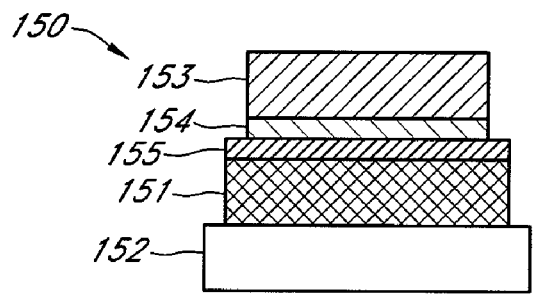
FIG. 17 illustrates a light-emitting device 150, which includes a light-emitting layer emitting layer 151 (containing lumophore-functionalized nanoparticles) positioned between an anode/glass substrate layer 152 and a cathode layer 153. The device 150 also includes an electron transport/injection layer 154 and a hole blocking layer 155 positioned between the cathode layer 153 and the light emitting layer 151.
Figure 18:
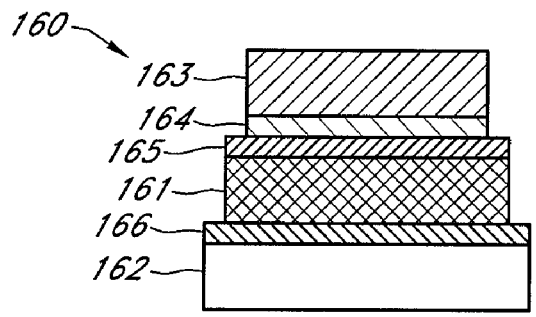
FIG. 18 illustrates a light-emitting device 160, which includes a light-emitting layer emitting layer 161 (containing lumophore-functionalized nanoparticles) positioned between an anode/glass substrate layer 162 and a cathode layer 163. The device 160 also includes an electron transport/injection layer 164 and a hole blocking layer 165 positioned between the cathode layer 163 and the light emitting layer 161, and a hole injection layer 166 positioned between the light emitting layer 161 and the anode/glass substrate layer 162.

FIG. 14 shows a UV-VIS spectra of the light emitted by the light-emitting devices of this example and that of Example 23. As shown in FIG. 14, the orange light intensity (~554 nm) of the light-emitting device of Example 23 (incorporating POSS-(blue)$_{21}$(orange)$_1$ nanoparticles) is about 4 times stronger than the blue light intensity (~450 nm). As a result, the light-emitting device of Example 23 emits yellow light (X=0.35, Y=0.48, as indicated in the CIE chart shown in FIG. 15B). In comparison, the yellow light intensity (~552 nm) of the light-emitting device of this example (incorporating POSS-(blue)$_{21}$(yellow)$_1$ nanoparticles) is almost equal to the blue light intensity (~450 nm). As a result, the light-emitting device of this example emits close to white light (X=0.31, Y=0.37, as indicated in the CIE chart shown in FIG. 15A).

Example 25

Fabrication of light-emitting device 140 (FIG. 16): A glass substrate is coated with 100-200 nm of ITO. The ITO coated substrate is cut into 1 inch square pieces and cleaned using consecutive ultrasonic baths of acetone, methanol, and isopropanol. The ITO anode is patterned either with a thick silicon oxide insulating layer or by etching the ITO with an acid bath to form the ITO anode/glass substrate layer 142. After patterning, the same cleaning procedure is implemented again followed by RF assisted plasma ashing for approximately 2 minutes. A light-emitting layer 141, comprising a host material and lumophore-functionalized nanoparticles, is deposited on top of the ITO anode/glass substrate layer 142 by spin-coating at 1000 rpm from a 15 mg/mL solution of the host material and nanoparticles in chloroform, and dried at 70-100° C. in a nitrogen glovebox. The host material is poly(N-vinylcarbazole) (PVK, 49.5% by weight based on total) and 2-(4-biphenyl)-5-(4-tert-butylphenyl)-1,3,4-oxadiazole (PBD, 49.5% by weight based on total), and the nanoparticles are POSS(blue)$_8$ and POSS(orange)$_8$ (together 1% by weight based on total, in varying ratios). The thickness of the resulting light-emitting layer 141 is 1200-1300 Å as measured by stylus profilometry. An electron transport/injection layer 144, comprising aluminum quinolate (Alq$_3$) or 1,3,5-tris[N-phenylbenzimidazol-2-yl]benzene (TPBI), is thermally deposited on top of the light-emitting layer 141. A 3300 Å cathode layer 143, comprising Mg:Ag (10:1), is then vapor evaporated onto the surface of the electron transport/injection layer 144 at a pressure of $2 \times 10^{-6}$ Torr to produce the light-emitting device 140 with an active area of 0.1 cm$^2$.

Example 26

Fabrication of light-emitting device 150 (FIG. 17): A glass substrate is coated with 100-200 nm of ITO. The ITO coated substrate is cut into 1 inch square pieces and cleaned using consecutive ultrasonic baths of acetone, methanol, and isopropanol. The ITO anode is patterned either with a thick silicon oxide insulating layer or by etching the ITO with an acid bath to form the ITO anode/glass substrate layer 152. After patterning, the same cleaning procedure is implemented again followed by RF assisted plasma ashing for approximately 2 minutes. A light-emitting layer 151, comprising a host material and lumophore-functionalized nanoparticles, is deposited on top of the ITO anode/glass substrate layer 152 by spin-coating at 1000 rpm from a 15 mg/mL solution of the host material and nanoparticles in chloroform, and dried at 70-100° C. in a nitrogen glovebox. The host material is poly(N-vinylcarbazole) (PVK, 49.5% by weight based on total) and 2-(4-biphenyl)-5-(4-tert-butylphenyl)-1,3,4-oxadiazole (PBD, 49.5% by weight based on total), and the nanoparticles are POSS(blue)$_8$ and POSS(orange)$_8$ (together 1% by weight based on total, in varying ratios). The thickness of the resulting light-emitting layer 151 is 1200-1300 Å as measured by stylus profilometry. A hole blocking layer 155, comprising bathocuproine (BCP), is vapor deposited on top of the light-emitting layer 151. An electron transport/injection layer 154, comprising aluminum quinolate (Alq$_3$) or 1,3,5-tris[N-phenylbenzimidazol-2-yl]benzene (TPBI), is thermally deposited on top of the hole blocking layer 155. A 3300 Å cathode layer 153, comprising Mg:Ag (10:1), is then vapor evaporated onto the surface of the electron transport/injection layer 154 at a pressure of $2 \times 10^{-6}$ Torr to produce the light-emitting device 150 with an active area of 0.1 cm$_2$.

Example 27

Fabrication of light-emitting device 160 (FIG. 18): A glass substrate is coated with 100-200 nm of ITO. The ITO coated substrate is cut into 1 inch square pieces and cleaned using consecutive ultrasonic baths of acetone, methanol, and isopropanol. The ITO anode is patterned either with a thick silicon oxide insulating layer or by etching the ITO with an acid bath to form the ITO anode/glass substrate layer 162. After patterning, the same cleaning procedure is implemented again followed by RF assisted plasma ashing for approximately 2 minutes. A hole injection/smoothing layer 166, comprising polyethylenedioxythiophene (PEDOT)/polystyrene sulphonic acid (PSS), is spin coated onto the surface of the ITO anode/glass substrate layer 162. A light-emitting layer 161, comprising a host material and lumophore-functionalized nanoparticles, is deposited on top of the hole injection/smoothing layer 166 by spin-coating at 1000 rpm from a 15 mg/mL solution of the host material and nanoparticles in chloroform, and dried at 70-100° C. in a nitrogen glovebox. The host material is poly(N-vinylcarbazole) (PVK, 49.5% by weight based on total) and 2-(4-biphenyl)-5-(4-tert-butylphenyl)-1,3,4-oxadiazole (PBD, 49.5% by weight based on total), and the nanoparticles are POSS (blue)$_8$ and POSS(orange)$_8$ (together 1% by weight based on total, in varying ratios). The thickness of the resulting light-emitting layer 161 is 1200-1300 Å as measured by stylus profilometry. A hole blocking layer 165, comprising bathocuproine (BCP), is vapor deposited on top of the light-emitting layer 161. An electron transport/injection layer 164, comprising aluminum quinolate (Alq$_3$) or 1,3,5-tris[N-phenylbenzimidazol-2-yl]benzene (TPBI), is thermally deposited on top of the hole blocking layer 165. A 3300 Å cathode layer 163, comprising Mg:Ag (10:1), is then vapor evaporated onto the surface of the electron transport/injection layer 164 at a pressure of 2×10$^{-6}$ Torr to produce the light-emitting device 160 with an active area of 0.1 cm$^2$.

It will be appreciated by those skilled in the art that various omissions, additions and modifications may be made to the processes described above without departing from the scope of the invention, and all such modifications and changes are intended to fall within the scope of the invention.

What is claimed is:

1. A light-emitting composition comprising a plurality of lumophore-functionalized nanoparticles of formula I;

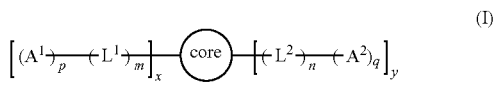

(I)

wherein:
core is a nanoparticle core;
A$^1$ and A$^2$ are each a lumophore;
L$^1$ and L$^2$ are each a linking group, wherein at least L$^2$ is branched;
m is 0 or an integer in the range of 1 to 10;
n is an integer in the range of 1 to 10;
p is an integer in the range of 0 to 5$^m$;
q is an integer in the range of 1 to 5$^n$;
x is 0 or an integer in the range of 1 to 100;
wherein for x≧2 each L$^1$ can be the same or different and each A$^1$ can be the same or different;
y is an integer in the range of 1 to 100;
wherein for y≧2 each L$^2$ can be the same or different and each A$^2$ can be the same or different;
with the proviso that L$^1$ and L$^2$ are topologically distinct from the core, compositionally distinct from the core, or both; and
provided that there are at least two lumophores, and at least one lumophore emits light having a wavelength different from the wavelength emited by at least one other lumophore.

2. The light-emitting composition of claim 1, wherein the nanoparticle core comprises a moiety selected from the group consisting of a silsequioxane, a cyclophosphazene, a triazine, a cyclodextrin, a calixarene, a phthalocyanine, and a silica particle.

3. The light-emitting composition of claim 2, wherein the silsequioxane comprises a 1,3,5,7,9,11,13,15-octakis(dimethylsilyloxy)pentacyclo-[9.5.1.1$^{3,9}$.1$^{5,15}$.1$^{7,13}$]-octasiloxane.

4. The light-emitting composition of claim 1 wherein the A$^1$ lumophore and A$^2$ lumophore are each independently selected from the group consisting of an orange light-emitting lumophore, a blue light-emitting lumophore and a yellow light-emitting lumophore.

5. The light-emitting composition of claim 4, wherein the blue light-emitting lumophore emits light having a wavelength in the range from 400 nm to 480 nm.

6. The light-emitting composition of claim 4, wherein the blue light-emitting lumophore is selected from the group consisting of a polyparaphenylene lumophore, a fluorene lumophore, a stilbene lumophore, a biphenyl lumophore and a polyaromatic hydrocarbon lumophore.

7. The light-emitting composition of claim 4, wherein the blue light-emitting lumophore is a fluorene lumophore.

8. The light-emitting composition of claim 4, wherein the blue light-emitting lumophore is a 2,7-bis-(2,2-diphenyl-vinyl)-fluorene lumophore.

9. The light-emitting composition of claim 4, wherein the orange light-emitting lumophore emits light having a wavelength in the range from 560 nm to 750 nm.

10. The light-emitting composition of claim 4, wherein the orange light-emitting lumophore is selected from the group consisting of a pyrromethene lumophore, a rhodamine lumophore, a metalloporphyrin lumophore, a metallophthalocyanine lumophore, a pyran-4-ylidene-malononitrile lumophore, a naphthylphenylamino-phenyl fumaronitrile lumophore and a rubrene lumophore.

11. The light-emitting composition of claim 4, wherein the orange light-emitting lumophore is a rubrene lumophore.

12. The light-emitting composition of claim 4, wherein the orange light-emitting lumophore is a 2-[2-tert-butyl-6-(2-{4-[(4-hexyl-phenyl)-phenyl-amino]-phenyl}-vinyl)-pyran-4-ylidene]-malononitrile lumophore.

13. The light-emitting composition of claim 4, wherein the yellow light-emitting lumophore emits light having a wavelength in the range from 480 nm to 560 nm.

14. The light-emitting composition of claim 4, wherein the yellow light-emitting lumophore is selected from the group consisting of a pyrromethene lumophore, a rhodamine lumophore, a metalloporphyrin lumophore, a metallophthalocyanine lumophore, a pyran-4-ylidene-malononitrile lumophore and a rubrene lumophore.

15. The light-emitting composition of claim 4, wherein the yellow light-emitting lumophore is a rubrene lumophore.

16. The light-emitting composition of claim 4, wherein the yellow light-emitting lumophore is a 2-{2-tert-butyl-6-[4-(N-phenyl-N-allyl)phenyl]-vinyl}-pyran-4-ylidene]-malononitrile lumophore.

17. The light-emitting composition of claim 1, wherein the total number of A$^1$ and A$^2$ lumophores attached to the nanoparticle core is in the range of from 1 to about 100.

18. The light-emitting composition of claim 17, wherein the total number of A$^1$ and A$^2$ lumophores attached to the nanoparticle core is in the range of about 8 to about 80.

19. The light-emitting composition of claim 18, wherein the total number of A$^1$ and A$^2$ lumophores attached to the nanoparticle core is in the range of about 8 to about 60.

20. The light-emitting composition of claim 19, wherein the total number of A$^1$ and A$^2$ lumophores attached to the nanoparticle core is in the range of about 8 to about 40.

21. The light-emitting composition of claim 20, wherein the total number of A$^1$ and A$^2$ lumophores attached to the nanoparticle core is in the range of about 8 to about 25.

22. The light-emitting composition of claim 21, wherein the total number of A$^1$ and A$^2$ lumophores attached to the nanoparticle core is about 22.

23. The light-emitting composition of claim 1, wherein m is zero and at least one $A^1$ lumophore emits light having a wavelength different from at least one $A^2$ lumophore.

24. The light-emitting composition of claim 23, wherein n is 1.

25. The light-emitting composition of claim 23, wherein at least one $A^1$ lumophore emits light having a wavelength in the range of from about 560 nm to about 750 nm and at least one $A^2$ lumophore emits light having a wavelength in the range of from about 400 nm to about 480 nm.

26. The light-emitting composition of claim 25, wherein the ratio of the number of $A^1$ lumophores that emit light having a wavelength in the range of from about 560 nm to about 750 nm to the number of $A^2$ lumophores that emit light having a wavelength in the range of from about 400 nm to about 480 nm is in the range of from about 1:99 to about 99:1.

27. The light-emitting composition of claim 26, wherein the ratio of the number of $A^1$ lumophores that emit light having a wavelength in the range of from about 560 nm to about 750 nm to the number of $A^2$ lumophores that emit light having a wavelength in the range of from about 400 nm to about 480 nm is in the range of from about 1:21 to about 1:21.

28. The light-emitting composition of claim 23, wherein at least one $A^1$ lumophore emits light having a wavelength in the range of from about 480 nm to about 560 nm and at least one $A^2$ lumophore emits light having a wavelength in the range of from about 400 nm to about 480 nm.

29. The light-emitting composition of claim 28, wherein the ratio of the number of $A^1$ lumophores that emit light having a wavelength in the range of from about 480 nm to about 560 nm to the number of $A^2$ lumophores that emit light having a wavelength in the range of from about 400 nm to about 480 nm is in the range of from about 1:99 to about 99:1.

30. The light-emitting composition of claim 29, wherein the ratio of the number of $A^1$ lumophores that emit light having a wavelength in the range of from 480 nm to about 560 nm to the number of $A^2$ lumophores that emit light having a wavelength in the range of from about 400 nm to about 480 nm is in the range of from about 1:21 to about 21:1.

31. A light emitting device, comprising:
an anode layer comprising a high work function metal;
a cathode layer comprising a low work function metal; and
a light-emitting layer positioned between, and electrically connected to, the anode layer and the cathode layer, the light-emitting layer comprising a composition according to claim 1.

32. The light emitting device of claim 31, wherein the light-emitting layer is configured to emit white light.

33. The light-emitting device of claim 31, wherein:
at least one lumophore is covalently attached to the nanoparticle core.

34. The light-emitting device of claim 33 wherein the nanoparticle core comprises a moiety selected from the group consisting of a silsequioxane, a cyclophosphazene, a metal phthalocyanine, and a silica particle.

35. The light-emitting device of claim 34, wherein the nanoparticle core comprises a 1,3,5,7,9,11,13,15-octakis (dimethylsilyloxy)pentacyclo-[9.5.1.1$^{3,9}$. 1$^{5,15}$.1$^{7,13}$]-octasiloxane.

36. The light-emitting device of claim 33, wherein the lumophore is selected from the group consisting of a red light-emitting lumophore, a blue light-emitting lumophore and yellow light-emitting lumophore.

37. The light-emitting device of claim 36, wherein the blue light-emitting lumophore emits light having a wavelength in the range of from about 400 nm to about 480 nm.

38. The light-emitting device of claim 36, wherein the blue light-emitting lumophore is selected from the group consisting of a polyparaphenylene lumophore, a fluorene lumophore, a stilbene lumophore, a biphenyl lumophore and a polyaromatic hydrocarbon lumophore.

39. The light-emitting device of claim 38, wherein the blue light-emitting lumophore is a fluorene lumophore.

40. The light-emitting device of claim 38, wherein the blue light-emitting lumophore is a 2,7-bis-(2,2-diphenyl-vinyl)-fluorene lumophore.

41. The light-emitting device of claim 36, wherein the red light-emitting lumophore emits light having a wavelength in the range of from about 560 nm to about 750 nm.

42. The light-emitting device of claim 36, wherein the red light-emitting lumophore is selected from the group consisting of a pyrromethene lumophore, a rhodamine lumophore, a metalloporphyrin lumophore, a metallophthalocyanine lumophore, a pyran-4-ylidene-malononitrile lumophore, a naphthylphenylamino-phenyl fumaronitrile lumophore and a rubrene lumophore.

43. The light-emitting device of claim 42, wherein the red light-emitting lumophore is a rubrene lumophore.

44. The light-emitting device of claim 42, wherein the red light-emitting lumophore is a 2-[2-tert-butyl-6-(2-{4-[(4-hexyl-phenyl)-phenyl-amino]-phenyl}-vinyl)-pyran-4-ylidene]-malononitrile lumophore.

45. The light-emitting device of claim 36, wherein the yellow light-emitting lumophore emits light having a wavelength in the range of from about 480 nm to about 560 nm.

46. The light-emitting device of claim 36, wherein the yellow light-emitting lumophore is selected from the group consisting of a pyrromethene lumophore, a rhodamine lumophore, a metalloporphyrin lumophore, a metallophthalocyanine lumophore, a pyran-4-ylidene-malononitrile lumophore and a rubrene lumophore.

47. The light-emitting device of claim 46, wherein the yellow light-emitting lumophore is a rubrene lumophore.

48. The light-emitting device of claim 46, wherein the yellow light-emitting lumophore is a 2-{2-tert-butyl-6-[4-(N-phenyl-N-allyl)phenyl]-vinyl}-pyran-4-ylidene]-malononitrile lumophore.

49. The light-emitting device of claim 33, wherein the number of lumophores attached to the nanoparticle core is in the range of from 1 to about 100.

50. The light-emitting device of claim 49, wherein the number of the lumophores attached to the nanoparticle core is 8, 15, 16, 22, 23 or 24.

51. The light-emitting device of claim 31, wherein:
two or more lumophores are covalently attached to the nanoparticle core, and at least one of the lumophores emits light having a wavelength different from at least one of the other lumophores.

52. The light-emitting device of claim 51, wherein at least one lumophore emits light having a wavelength in the range of from about 560 nm to about 750 nm and at least one other lumophore emits light having a wavelength in the range of from about 400 nm to about 480 nm.

53. The light-emitting device of claim 52, wherein the ratio of the number of lumophores that emit light having a wavelength in the range of from about 560 nm to about 750 nm to the number of the lumophores that emit light having a wavelength in the range of from about 400 nm to about 480 nm is in the range of from about 1:99 to about 99:1.

54. The light-emitting device of claim 52, wherein the ratio of the number of lumophores that emit light having a wavelength in the range of from about 560 nm to about 750 nm to the number of the lumophores that emit light having a wavelength in the range of from about 400 nm to about 480 nm is in the range of from about 1:21 to about 1:21.

55. The light-emitting device of claim 51, wherein at least one lumophore emits light having a wavelength in the range of from about 480 nm to about 560 nm and at least one other lumophore emits light having a wavelength in the range from 400 nm to 480 nm.

56. The light-emitting device of claim 55, wherein the ratio of the number of lumophores that emit light having a wavelength in the range of from about 480 nm to about 560 nm to the number of the lumophores that emit light having a wavelength in the range of from about 400 nm to about 480 nm is in the range of from about 1:99 to about 99:1.

57. The light-emitting device of claim 55, wherein the ratio of the number of lumophores that emit light having a wavelength in the range of from about 480 nm to about 560 nm to the number of the lumophores that emit light having a wavelength in the range of from about 400 nm to about 480 nm is in the range of from about 1:21 to about 1:21.

58. The light emitting device of claim 31, wherein the light-emitting layer further comprises at least one selected from a hole transport material and an electron transport material.

59. The light-emitting device of claim 58, wherein the hole transport material is selected from the group consisting of an aromatic amine, an aromatic phosphine, a thiophene, a polymer thereof, and a mixture thereof.

60. The light-emitting device of claim 58, wherein the electron transport material is selected from the group consisting of an aromatic oxadiazole, a quinoline, a triazole, a pyridine, a dicyanoimidazole, a cyano aromatic, a polymer thereof, and a mixture thereof.

61. The light-emitting device of claim 58, wherein the amount of the hole transport material in the light-emitting layer is in the range of from about 1% to about 99% by weight based on total weight of the light-emitting layer.

62. The light-emitting device of claim 58, wherein the amount of the hole transport material in the light-emitting layer is in the range of from about 30% to about 70% by weight based on total weight of the light-emitting layer.

63. The light-emitting device of claim 58, wherein the amount of the electron transport material in the light-emitting layer is in the range of from about 1% to about 99% by weight based on total weight of the light-emitting layer.

64. The light-emitting device of claim 58, wherein the amount of the electron transport material in the light-emitting layer is in the range of from about 30% to about 70% by weight based on total weight of the light-emitting layer.

65. The light-emitting device of claim 31, wherein the amount of the composition in the light-emitting layer is in the range of from about 1% to about 100% by weight based on total weight of the light-emitting layer.

66. The light-emitting device of claim 31, wherein the amount of the composition in the light-emitting layer is in the range of from about 1% to about 10% by weight based on total weight of the light-emitting layer.

67. The light-emitting device of claim 31, wherein the high work function metal is selected from the group consisting of Au, Pt, indium-tin-oxide (ITO), and alloys thereof.

68. The light-emitting device of claim 31, wherein the low work function metal is selected from the group consisting of Al, Ag, Mg, Ca, Cu, Mg/Ag, LiF/Al, CsF, CsF/Al and alloys thereof.

69. The light-emitting device of claim 31, wherein the anode layer has a thickness in the range of from about 1 nm to about 1000 nm.

70. The light-emitting device of claim 31, wherein the cathode layer has a thickness in the range of from about 1 nm to about 1000 nm.

71. The light-emitting device of claim 31, wherein the light-emitting layer has a thickness in the range of from about 50 nm to about 250 nm.

72. The light-emitting device of claim 31, further comprising an electron transport/injection layer.

73. The light-emitting device of claim 72, wherein the electron transport/injection layer comprises aluminum quinolate ($Alq_3$), 2-(4-biphenylyl)-5-(4-tert-butylphenyl)-1,3,4-oxadiazole (PBD), phenanthroline, quinoxaline, 1,3,5-tris[N-phenylbenzimidazol-z-yl] benzene (TPBI), or a derivative thereof.

74. The light-emitting device of claim 31, further comprising a hole-blocking layer.

75. The light-emitting device of claim 74, wherein the hole-blocking layer comprises bathocuproine (BCP), 3,4,5-triphenyl-1,2,4-triazole, 3,5-bis(4-tert-butyl-phenyl)-4-phenyl-[1,2,4] triazole, 2,9-dimethyl-4,7-diphenyl-1,10-phenanthroline, or 1,1-bis(4-bis(4-methylphenyl)aminophenyl) cyclohexane.

76. The light-emitting device of claim 31, further comprising a hole injection layer.

77. The light-emitting device of claim 76, wherein the hole injection layer comprises a polythiophene derivative, a benzidine derivative, poly(N,N'-bis(4-butylphenyl)-N,N'-bis (phenyl)benzidine), a triphenylamine, a phenylenediamine derivative, 4,4',4"-tris(N-(naphthylen-2-yl)-N-phenylamino) triphenylamine, an oxadiazol derivative, a polyacetylene derivative, or a phthalocyanine metal complex derivative.

78. The light-emitting device of claim 31, wherein the composition comprises:
a plurality of first lumophore-functionalized nanoparticles of formula I comprising from about 8 to about 24 blue light-emitting lumophores; and
a plurality of second lumophore-functionalized nanoparticles of formula I comprising from about 8 to about 24 red light-emitting lumophores.

79. The light-emitting device of claim 78, wherein the ratio of the number of the first lumophore-functionalized nanoparticles to the number of the second lumophore-functionalized nanoparticles is in the range of from about 1 to about 2000.

80. The light-emitting device of claim 78, wherein the ratio of the number of the first lumophore-functionalized nanoparticles to the number of the second lumophore-functionalized nanoparticles is in the range of from about 1 to about 1000.

81. A light-emitting composition comprising;

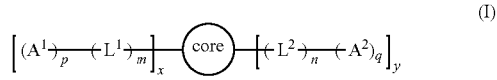

(I)

wherein:
core is a nanoparticle core;
$A^1$ and $A^2$ are each a lumophore;
$L^1$ and $L^2$ are each independently a linking group comprising a divalent, a trivalent, a tetravalent, or a pentavalent moiety;
m is 0 or an integer in the range of 1 to 10;
n is an integer in the range of 1 to 10;
p is an integer in the range of 0 to $5^m$;
q is an integer in the range of 1 to $5^n$;
x is 0 or an integer in the range of 1 to 100;

wherein for x≧2 each $L^1$ can be the same or different and each $A^1$ can be the same or different;

y is an integer in the range of 1 to 100;

wherein for y≧2 each $L^2$ can be the same or different and each $A^2$ can be the same or different;

with the proviso that $L^1$ and $L^2$ are topologically distinct from the core, compositionally distinct from the core, or both; and provided that there are at least two lumophores, and at least one lumophore emits light having a wavelength different from the wavelength emitted by at least one other lumophore.

82. The light-emitting composition of claim 81, wherein the divalent moiety is selected from the group consisting of:

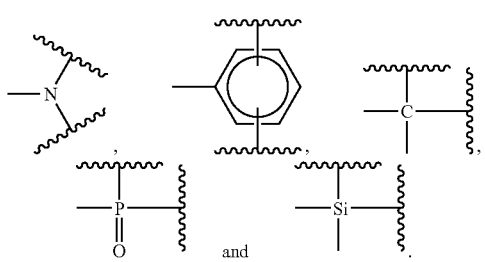

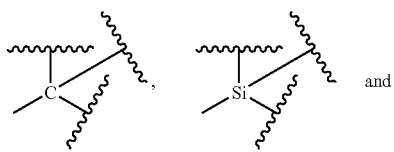

83. The light-emitting composition of claim 81, wherein the trivalent moiety is selected from the group consisting of:

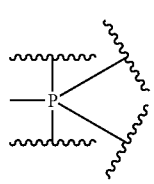 , 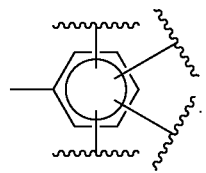 and

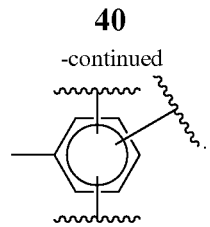 .

84. The light-emitting composition of claim 81, wherein the tetravalent moiety is selected from the group consisting of:

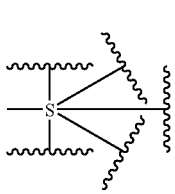 and 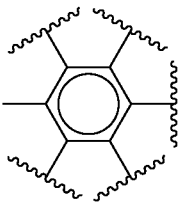 .

85. The light-emitting composition of claim 81, wherein the pentavalent moiety is selected from the group consisting of:

* * * * *

UNITED STATES PATENT AND TRADEMARK OFFICE
CERTIFICATE OF CORRECTION

| | | |
|---|---|---|
| PATENT NO. | : 7,993,747 B2 | Page 1 of 1 |
| APPLICATION NO. | : 11/747624 | |
| DATED | : August 9, 2011 | |
| INVENTOR(S) | : Amane Mochizuki et al. | |

It is certified that error appears in the above-identified patent and that said Letters Patent is hereby corrected as shown below:

At Column 2, Line 54, Change "$L_2$" to --$L^2$--.

At Column 7, Line 34, Change "phenylbenzimidazol-z-yl]" to --phenylbenzimidazol-2-yl--.

At Column 7, Lines 46-47, Change "polytheylenedioxythiophene" to --polyethylenedioxythiophene--.

At Column 10, Line 28 (Approx.), Change "the a" to --the--.

At Column 10, Line 34 (Approx.), Change "[9,5.1." to --[9.5.1.--.

At Column 19, Lines 33-34, Change "Lumophore-Functionalized Nanoparticles Described Herein" to --lumophore-functionalized nanoparticles described herein--.

At Column 21, Line 40, Change "elluent" to --eluent--.

At Column 22, Line 1, Change "elluent" to --eluent--.

At Column 22, Line 35 (Approx.), Change "layer" to --layer was--.

At Column 23, Line 35, Change "layer" to --layer was--.

At Column 24, Line 14, Change "2,6-leutidine" to --2,6-lutidine--.

At Column 25, Line 66 (Approx.), Change "chromoatographed" to --chromatographed--.

At Column 32, Line 49, Change "$cm_2$." to --$cm^2$.--.

At Column 33, Line 57, In Claim 1, Change "emited" to --emitted--.

At Column 35, Line 19, In Claim 27, Change " $A'$ " to --$A^1$--.

At Column 35, Line 36, In Claim 30, Change " $\bar{A}'$ " to --$A^1$--.

At Column 38, Line 13 (Approx.), In Claim 73, Change "phenylbenzimidazol-z-yl]" to --phenylbenzimidazol-2-yl]--.

Signed and Sealed this
Eleventh Day of September, 2012

David J. Kappos
*Director of the United States Patent and Trademark Office*